United States Patent [19]
Shiotsuka et al.

[11] Patent Number: 6,121,542
[45] Date of Patent: *Sep. 19, 2000

[54] PHOTOVOLTAIC DEVICE

[75] Inventors: Hidenori Shiotsuka, Nara; Takahiro Mori, Ikoma; Ichiro Kataoka, Kyoto-fu; Takeshi Takada, Kyoto-fu; Satoru Yamada, Kyoto-fu; Ayako Shiotsuka, Nara, all of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/857,906

[22] Filed: May 16, 1997

[30] Foreign Application Priority Data

May 17, 1996 [JP] Japan ................................. 8-146543

[51] Int. Cl.[7] .................................................. H01L 31/00
[52] U.S. Cl. ............................................. 136/256; 438/57
[58] Field of Search ................................ 136/256; 438/57

[56] References Cited

U.S. PATENT DOCUMENTS

| | | | |
|---|---|---|---|
| 4,260,429 | 4/1981 | Moyer | 136/256 |
| 5,084,107 | 1/1992 | Deguchi et al. | 136/256 |
| 5,389,159 | 2/1995 | Kataoka et al. | 136/251 |
| 5,428,249 | 6/1995 | Sawayama et al. | 136/256 |
| 5,679,176 | 10/1997 | Tsuzuki et al. | 136/251 |
| 5,681,402 | 10/1997 | Ichinose et al. | 136/256 |
| 5,759,291 | 6/1998 | Ichinose et al. | 136/256 |
| 5,942,048 | 8/1999 | Fujisaki et al. | 136/256 |

FOREIGN PATENT DOCUMENTS

| | | |
|---|---|---|
| 0531827A1 | 3/1993 | European Pat. Off. . |
| 0684652A2 | 11/1995 | European Pat. Off. . |
| 0710991A1 | 5/1996 | European Pat. Off. . |

*Primary Examiner*—Roland Martin
*Attorney, Agent, or Firm*—Fitzpatrick, Cella, Harper & Scinto

[57] ABSTRACT

A photovoltaic device including a photovoltaic element comprising a substrate having an electrically conductive face, a semiconductor layer formed on said electrically conductive surface of said substrate, and a transparent and electrically conductive electrode layer formed on said semiconductor layer; a power generation region having a metallic wire arranged over said transparent and electrically conductive electrode layer of said photovoltaic element; and a fixing region of fixing an end portion of said metallic wire, wherein said metallic wire is fixed to a polymer film through an adhesive material, and if necessary, said metallic wire is positioned between a bus bar and said adhesive material while electrically connecting with said bus bar. A solar cell module, construction member, or power generation apparatus comprising said photovoltaic device. A process for producing said photovoltaic device.

27 Claims, 7 Drawing Sheets

F I G. 3(a)
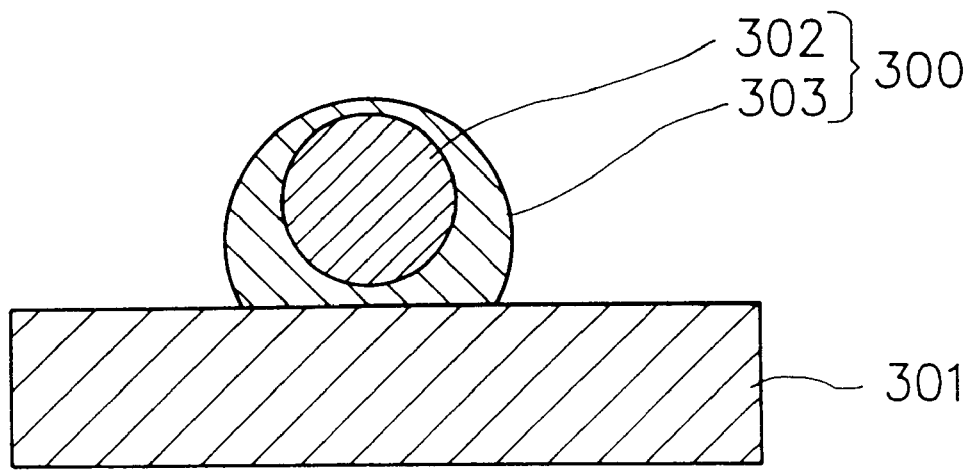
F I G. 3(b)
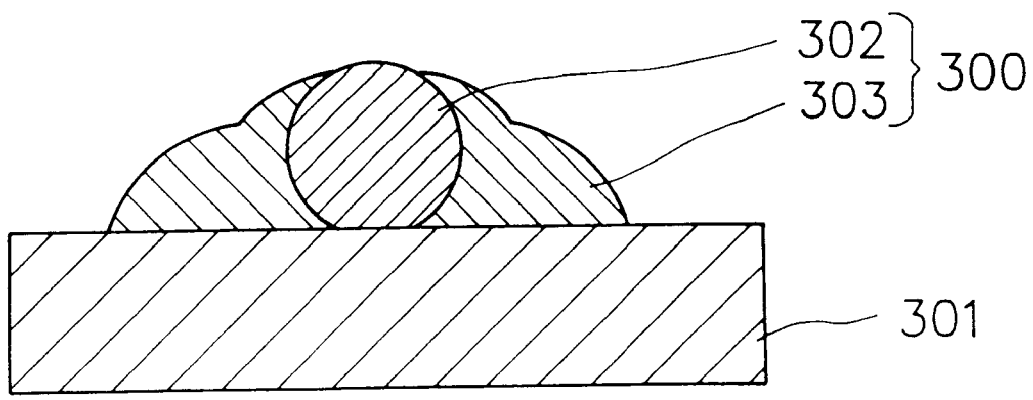

PHOTOVOLTAIC DEVICE

BACKGROUND OF THE INVENTION

1. Field of the Invention

The present invention relates to a photovoltaic device having a highly reliable electrode structure and a process for producing said photovoltaic device. More particularly, the present invention relates to a photovoltaic device having a collecting electrode comprising a metallic wire and a bus bar and having an improved connection structure with respect to said metallic wire and bus bar.

2. Related Background Art

It is known to dispose a plurality of linear electrodes on the front surface of a solar cell in order to efficiently collect a electric power generated by the solar cell. It is also known to dispose a common bus bar at end portions of said linear electrodes in order to output the electric power collected by the linear electrodes to the outside.

Particularly, U.S. Pat. No. 4,260,429 discloses that as the collecting electrode disposed on the front surface of a solar cell, a plurality of metallic wires coated by a polymer material containing electrically conductive particles are fixed on the front surface of the solar cell by way of heat or/and pressure and a common bus bar is connected to end portions of the metallic wires.

U.S. Pat. No. 5,084,107 discloses a manner of providing a plurality of metallic wires having opposite end portions supported by clamps, applying an electrically conductive adhesive onto at least partial portions of the metallic wires, subjecting the metallic wires applied with the electrically conductive adhesive to heat treatment while pressing the metallic wires onto the front surface of a solar cell whereby solidifying the electrically conductive adhesive, and cutting the metallic wires, whereby collecting electrodes are formed on the front surface of the solar cell. This document also discloses that a collection electrode for collecting electric currents of the metallic wires is connected to the metallic wires.

Now, in order to connect the metallic wire as the collecting electrode with the bus bar, there are known a manner of using an electrically conductive paste, and another manner of using a solder. In the case of using the electrically conductive paste, there is often employed a manner of discharging the electrically conductive paste to predetermined several points using an applicator, followed by drying or curing the electrically conductive paste thus applied. In the case of using the solder, there is usually employed a manner of directly connecting the metallic wire with the bus bar by means of the solder.

However, any of these manners is liable to entail such problems as will be described below in the case of using such electrode configuration as described in the prior art in a solar cell.

(1) In the case of connecting a metallic member with the bus bar using the solder in order to integrate collecting electrodes, by-pass diodes, or photovoltaic elements (or solar cells) in series connection or parallel connection, the solder is fused. In this case, it is necessary to locally apply a high temperature heat of 250 to 350° C., where the photovoltaic elements are liable to suffer from damages due to the heat applied thereon, resulting in deteriorating the characteristics of the photovoltaic elements.

(2) In the case of connecting the collecting electrode comprising the metallic wire with the bus bar by means of the solder, it is difficult to connect the collecting electrode with the bus bar through such adhesive layer of the foregoing electrically conductive adhesive. Therefore, it is necessary that the adhesive layer is partially removed and the soldering is conducted. In this case, bonding is necessary to be conducted at a number of points and because of this, the working efficiency is inferior.

(3) As the bus bar, a metal body having burs and which is liable to fracture is usually used. Therefore, the burs or fractured portions of the bus bar are liable to get into the semiconductor layer of the photovoltaic element whereby short-circuiting the photovoltaic element.

(4) In the case of connecting the metallic wire with the bus bar using an Ag-paste as the electrically conductive paste, it is necessary to use an appropriate applicator capable of discharging the Ag-paste in a desired amount and in addition to this, it is necessary to employ a plurality of steps of heating, drying, and curing the Ag-paste.

In this case, since the Ag-paste is applied on an uneven surface, it is difficult to attain a uniform thickness for the resulting Ag-paste layer. This situation is liable to entail a problem in that it is difficult to attain a resin sealing with no defect such as air bubble for the photovoltaic element in the lamination process for sealing a photovoltaic device comprising the photovoltaic element.

(5) In the case of using the solder, when a flux is together used or a resin flux cored solder is used in order to attain good soldering, it is necessary to separately conduct the steps of removing the flux or the resin flux by way of ultrasonic cleaning or the like and drying the resultant.

(6) In any of the above described manners, when the metallic wire as the collecting electrode is extended and arranged on the front surface of the photovoltaic element, it is provisionally fixed to a non-power generation region of the photovoltaic element. In this case, there is a problem in that it is necessary to have an extra area for the provisional fixing other than the bus bar-forming area.

SUMMARY OF THE INVENTION

An object of the present invention is to eliminate the foregoing problems in the prior art and to provide a highly reliable electrode structure for a photovoltaic device, which can be efficiently formed at an adequate working efficiency.

A typical embodiment of the electrode structure according to the present invention comprises a power generation region having a metallic wire as a collecting electrode arranged over a transparent and electrically conductive electrode layer for a photovoltaic element and a fixing region of fixing opposite end portions of said metallic wire, wherein said metallic wire is fixed to a heat resistant polymer film through an adhesive material.

Another typical embodiment of the electrode structure according to the present invention comprises a power generation region having a metallic wire as a collecting electrode arranged over a transparent and electrically conductive electrode layer for a photovoltaic element and a fixing region of fixing opposite end portions of said metallic wire, wherein said metallic wire is fixed to a heat resistant polymer film through an adhesive material, and said metallic wire is positioned between a bus bar and said adhesive material while electrically connecting with said bus bar.

Another object of the present invention is to provide an improved photovoltaic device provided with said electrode structure, which exhibits satisfactory photovoltaic characteristics.

A further object of the present invention is to provide a process which enables one to efficiently produce said photovoltaic device at a high yield.

BRIEF DESCRIPTION OF THE DRAWINGS

FIG. 3(a) is a schematic cross-sectional view illustrating an example of a configuration of a collecting electrode disposed on a photovoltaic element in the present invention.

FIG. 3(b) is a schematic cross-sectional view illustrating another example of a configuration of a collecting electrode disposed on a photovoltaic element in the present invention.

DESCRIPTION OF THE INVENTION AND PREFERRED EMBODIMENTS

Figure 1A:
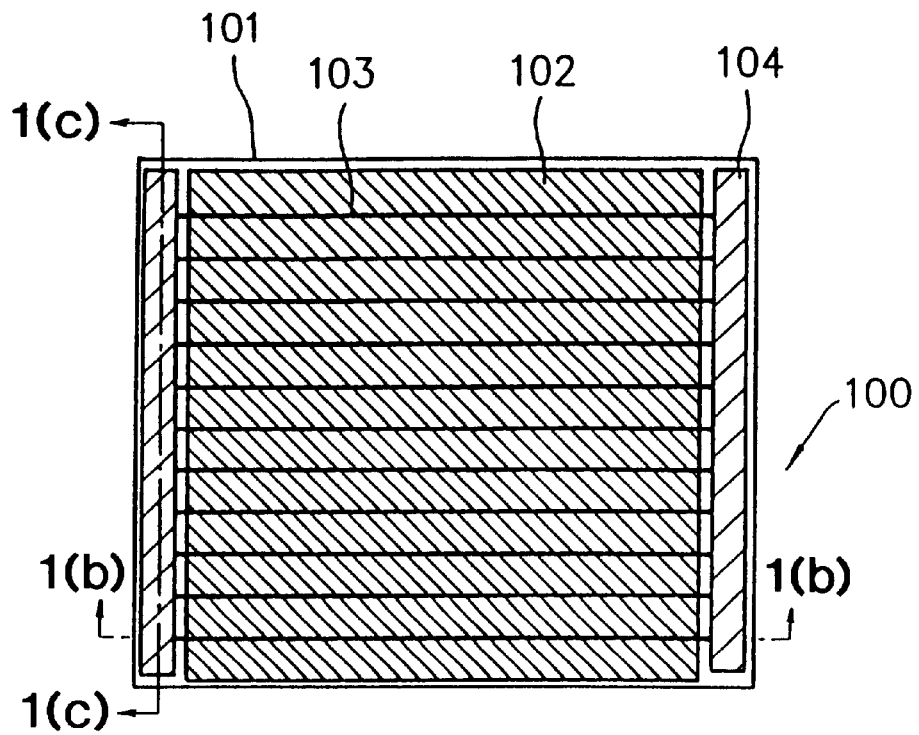
FIG. 1(a) is a schematic plan view illustrating an example of a photovoltaic device according to the present invention.

The present invention will be detailed with reference to embodiments which will be described below. It should be understood that the present invention is limited to these embodiments.

As previously described, the present invention provides an improved photovoltaic device provided with a highly reliable electrode structure and a process for producing said photovoltaic device.

A typical embodiment of the photovoltaic device according to the present invention includes a photovoltaic element comprising a substrate having an electrically conductive surface, a semiconductor layer formed on said electrically conductive surface of said substrate, and a transparent and electrically conductive electrode layer formed on said semiconductor layer; a power generation region having a metallic wire arranged over said transparent and electrically conductive electrode layer of said photovoltaic element; and a fixing region of fixing an end portion of said metallic wire, wherein said metallic wire is fixed to a heat resistant polymer film through an adhesive material.

Another typical embodiment of the photovoltaic device according to the present invention includes a photovoltaic element comprising a substrate having an electrically conductive surface, a semiconductor layer formed on said electrically conductive surface of said substrate, and a transparent and electrically conductive electrode layer formed on said semiconductor layer; a power generation region having a metallic wire arranged over said transparent and electrically conductive electrode layer of said photovoltaic element; and a fixing region of fixing an end portion of said metallic wire, wherein said metallic wire is fixed to a heat resistant polymer film through an adhesive material, and said metallic wire is positioned between a bus bar and said adhesive material while electrically connecting with said bus bar.

A typical embodiment of the process according to the present invention is a process for producing a photovoltaic device including a photovoltaic element comprising a substrate having an electrically conductive surface, a semiconductor layer formed on said electrically conductive surface of said substrate, and a transparent and electrically conductive electrode layer formed on said semiconductor layer; a power generation region having a metallic wire arranged over said transparent and electrically conductive electrode layer of said photovoltaic element; and a fixing region of fixing an end portion of said metallic wire, characterized by comprising the steps of:

arranging an adhesive body comprising an adhesive material and a heat resistant polymer film layer at said fixing region, arranging said metallic wire on both said adhesive body and said transparent and electrically conductive electrode layer on said semiconductor, arranging a bus bar on both said adhesive body and said metallic wire, and bonding said metallic wire with said bus bar by means of an electrically conductive adhesive and by way of heat or/and pressure.

The photovoltaic device provided with the specific electrode structure according to the present invention has various advantages as will be described below.

(i) When high temperature heat of 300 to 400° C. should be locally applied upon connecting the metallic wire with the bus bar by means of a solder, the photovoltaic element is desirably protected from being damaged due to the heat applied and because of this, the yield of the photovoltaic element is markedly improved. Further, the body comprising the heat resistant polymer film and the adhesive material enables to maintain a desired interval between the bus bar and the photovoltaic element and because of this, the photovoltaic element is desirably protected from suffering from problems due to bur or fracture of a metal body used as the bus bar.

(ii) The current collecting property of the metallic wire as the collecting electrode is improved while establishing a highly reliable electrode structure with a markedly diminished shadow loss.

(iii) The connection of the metallic wire with the bus bar is ensured and the contact resistance of the connection face between them is desirably diminished.

(iv) Metal ion from the metallic wire is desirably prevented from migrating into the power generation active area of the photovoltaic element, whereby the occurrence of shunt due to the metal migration is effectively prevented, resulting in a marked improvement in the reliability of the photovoltaic element.

(v) When an adhesive material exhibiting a hygroscopicity of 1.5 or less when maintained in an atmosphere of 40°

C./80% RH for 12 hours as the adhesive material, resin sealing for the photovoltaic element can be effectively conducted such that it has a resin seal having a desirable external appearance with no defect such as pore or air bubble.

(vi) The photovoltaic device excels in characteristics required for a photovoltaic device. Particularly, for instance, the power generation is efficiently conducted by the photovoltaic element and the electricity generated is efficiently collected by the bus bar.

The process for the production of a photovoltaic device according to the present invention enables to efficiently produce a highly reliable photovoltaic device at an improved yield by a simple production process with a diminished number of steps.

In the following, the present invention will be detailed while referring to the drawings.

Figure 1B:
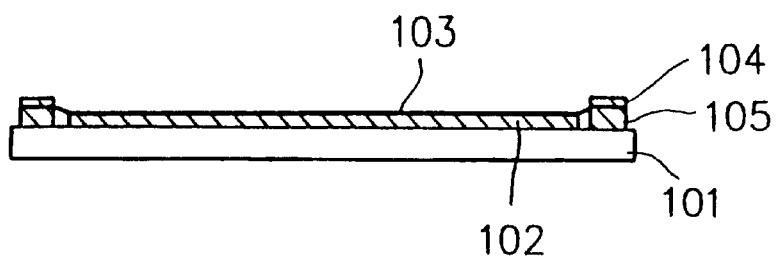
FIG. 1(b) is a schematic cross-sectional view, taken along the line A–A' in FIG. 1(a).
Figure 1C:
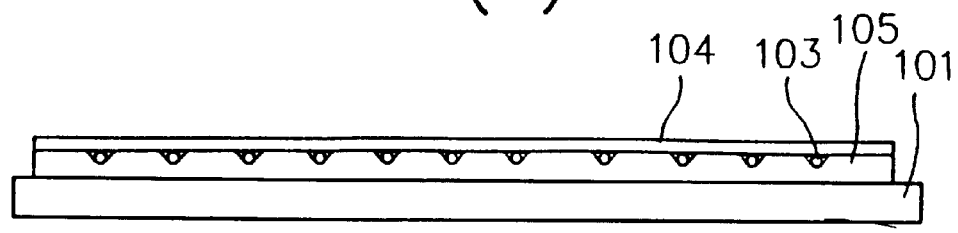
FIG. 1(c) is a schematic cross-sectional view, taken along the line B–B' in FIG. 1(a).

FIG. 1(a) is a schematic plan view illustrating an example of a photovoltaic device according to the present invention. FIG. 1(b) is a schematic cross-sectional view, taken along the line A–A' in FIG. 1(a). FIG. 1(c) is a schematic cross-sectional view, taken along the line B–B' in FIG. 1(a).

In FIGS. 1(a) through 1(c), reference numeral 100 indicates a photovoltaic device, reference numeral 101 a substrate at least having an electrically conductive surface, reference numeral 102 a photovoltaic element comprising a lower electrode layer and a photoelectric conversion semiconductor layer and if necessary, a transparent and electrically conductive layer (these layers are not shown), reference numeral 103 a metallic wire as a first collecting electrode, reference numeral 104 a bus bar as a second collecting electrode, reference numeral 105 an adhesive body. When the substrate 101 comprises a member having an electrically conductive surface, it is not always necessary for the lower electrode layer to be provided.

Now, as apparent from FIGS. 1(b) and 1(c), the adhesive body 105 is disposed on each of opposite exposed surface regions of the substrate 101 where no photoelectric element is present.

In FIGS. 1(a) through 1(c), the bus bar 104 is disposed on the adhesive body disposed on each of said opposite exposed surface regions of the substrate 101. It is possible for the bus bar to be disposed over only one of the opposite exposed surface regions of the substrate 101.

The metallic wire 103 serves as a first collecting electrode to efficiently collect an electric current generated by the photovoltaic element 102. The bus bar 104 serves as a second collecting electrode to collectively output the electric current collected by the metallic wire 103 to the outside.

The adhesive body 105 serves to fix the metallic wire 103 and the bus bar 104 to the photovoltaic element 102.

As apparent with reference to FIG. 1(b), each end portion of the metallic wire 103 is sandwiched between the adhesive body 105 and the bus bar 104 which are disposed on the substrate 101.

Similarly, as apparent with reference to FIG. 1(c), the metallic wire 103 is arranged such that it is embedded in the adhesive body 105 while being sandwiched between the adhesive body 105 and the bus bar 104, wherein the bus bar 104 is also contacted with the adhesive body 105.

The preparation of the photovoltaic device shown in FIGS. 1(a) through 1(c) may be conducted, for instance, in the following manner.

There is provided a photovoltaic element 102 (comprising at least a photoelectric conversion semiconductor layer) formed on a substrate 101 having an electrically conductive surface such that the photovoltaic element 102 is situated on the electrically conductive surface of the substrate 101 while leaving an exposed peripheral surface region of the substrate 101 on each of the opposite outsides of the photovoltaic element 102. An adhesive body 105 is arranged on and fixed to each of the opposite exposed surface regions of the substrate 101.

A plurality of metallic wires 103 coated by an electrically conductive adhesive are spacedly arranged so as to situate on the surface of the photovoltaic element 102 and the opposite exposed surface regions of the substrate 101, wherein the opposite end portions of each metallic wire 103 are fixed by means of the adhesive bodies 105.

A bus bar 104 comprising a metal body is arranged on each of the opposite adhesive bodies 105 so as to sandwich the metallic wires 103 between the bus bar 104 and the adhesive body 105, wherein the bus bar 104 is also fixed by means of the adhesive body 105.

A product thus obtained is subject to thermocompression treatment, where the electrically conductive adhesives of the metallic wires 103 are fused and solidified to accomplish electrical and mechanical connection of the metallic wires 103 with the photovoltaic element 102 and the bus bars 104. By this, there is obtained a photovoltaic device of the configuration shown in FIGS. 1(a) trough 1(c).

The electrically conductive adhesive of the metallic wire 103 is not always necessary to be disposed on the entire of the metallic wire. The electrically conductive adhesive may be disposed such that at least a part of the metallic wire 103 to be contacted with the bus bar is provided with the adhesive.

Figure 2A:
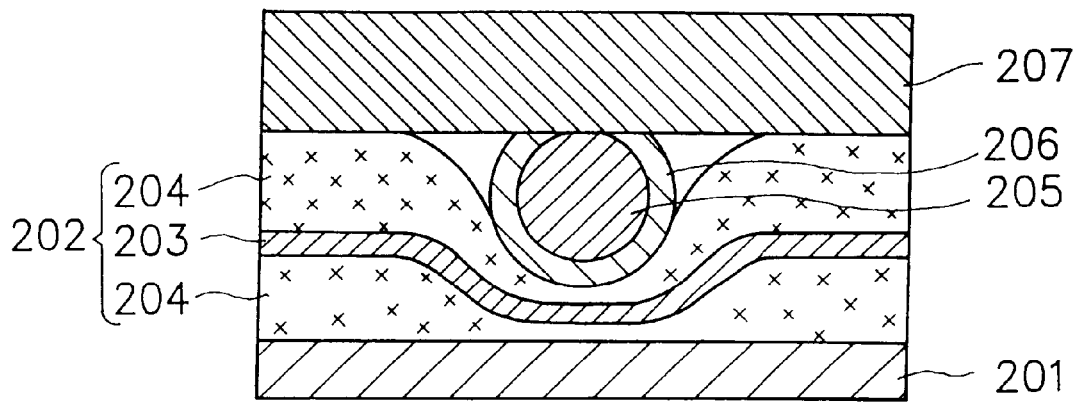
FIG. 2(a) is a schematic cross-sectional view illustrating an example of an electrode structure for a photovoltaic device according to the present invention.
Figure 2B:
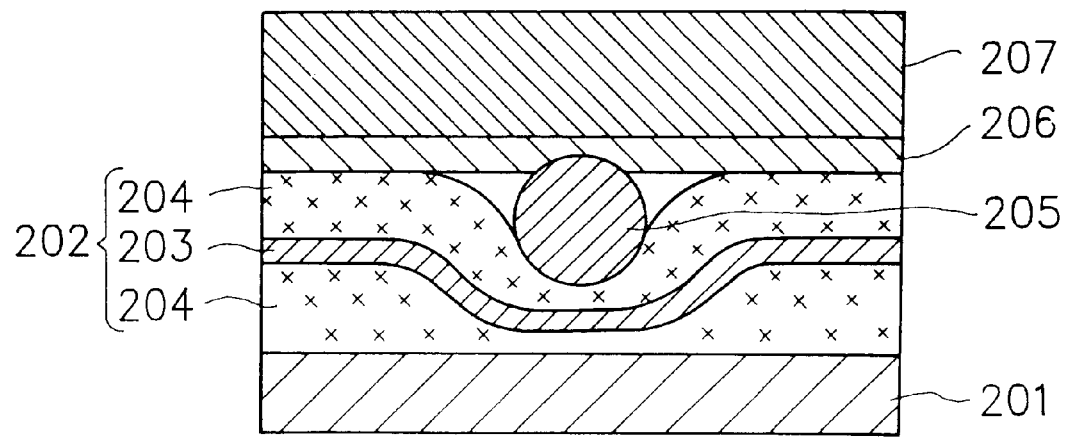
FIG. 2(b) is a schematic cross-sectional view illustrating another example of an electrode structure for a photovoltaic device according to the present invention.

FIGS. 2(a) and 2(b) are schematic cross-sectional views respectively illustrating an example of an electrode structure (comprising an adhesive body disposed on a surface of a photovoltaic element and a metallic wire as a first collecting electrode embedded in said adhesive body while electrically connected with a bus bar as a second collecting electrode) for a photovoltaic device according to the present invention, where a cross section of an end portion of said electrode structure in each case is shown.

In FIGS. 2(a) and 2(b), reference numeral 201 indicates a photovoltaic element (comprising at least a photoelectric conversion semiconductor layer, and if necessary, a transparent and electrically conductive layer, formed on an electrically conductive surface of a substrate as well as in the case shown in FIGS. 1(a) through 1(c)), reference numeral 202 a adhesive body comprising a polymer film 203 interposed between two adhesive materials 204, reference numeral 205 an end portion of a metallic wire as a first collecting electrode (this will be hereinafter simply as metallic wire), reference numeral 206 an electrically conductive adhesive, and reference numeral 207 a bus bar as a second collecting electrode.

In the electrode structure shown in FIG. 2(a), the metallic wire 205 coated by the electrically conductive adhesive 206 is arranged such that it is embedded in the adhesive body 202 while being contacted with the bus bar.

In the electrode structure shown in FIG. 2(b), the metallic wire 205 with no coat of the electrically conductive adhesive 206 is arranged such that it is embedded in the adhesive body 202 while being contacted with the bus bar through a layer comprising the electrically conductive adhesive 206.

In the case of the electrode structure shown in FIG. 2(a), the electrically conductive adhesive of the metallic wire 206 is not always necessary to be disposed on the entire of the metallic wire 205. The electrically conductive adhesive may be disposed such that at least a part of the metallic wire 205 to be contacted with the bus bar 207 is provided with the adhesive. If necessary, the bus bar may be also provided with an electrically conductive adhesive (this is not shown in the figure).

In any case, the photovoltaic element may be provided with a transparent and electrically conductive layer formed on the surface thereof.

The surface of the photovoltaic element 201 on which the adhesive body 202 is to be disposed may be an exposed surface of the photoelectric conversion layer, an exposed surface of the substrate or an exposed surface of the transparent and electrically conductive layer.

The surface region of the photovoltaic element 201 on which the above electrode structure configuration shown in FIGS. 1(a) or 1(b) is established will be hereinafter occasionally referred to as "metallic wire's end portion-fixing surface region 201".

FIG. 3(a) is a schematic cross-sectional view illustrating an example of a configuration of a first collecting electrode disposed on a photovoltaic element in the present invention. FIG. 3(b) is a schematic cross-sectional view illustrating another example of a configuration of a first collecting electrode disposed on a photovoltaic element in the present invention.

In FIGS. 3(a) and 3(b), reference numeral 301 indicates a photovoltaic element, and reference numeral 300 a first collecting electrode comprising a metallic wire 302 and an electrically conductive adhesive 303.

The configuration shown in FIG. 3(a) shows a case wherein the first collecting electrode 300 comprising the metallic wire 302 coated by the electrically conductive adhesive 303 is bonded onto the surface of photovoltaic element 301 through the electrically conductive adhesive 303.

The configuration shown in FIG. 3(b) shows a case wherein the metallic wire 302 is first arranged on the surface of the photovoltaic element 301, and the surface of the metallic wire 302 is partially coated by the electrically conductive adhesive.

Figure 4A:
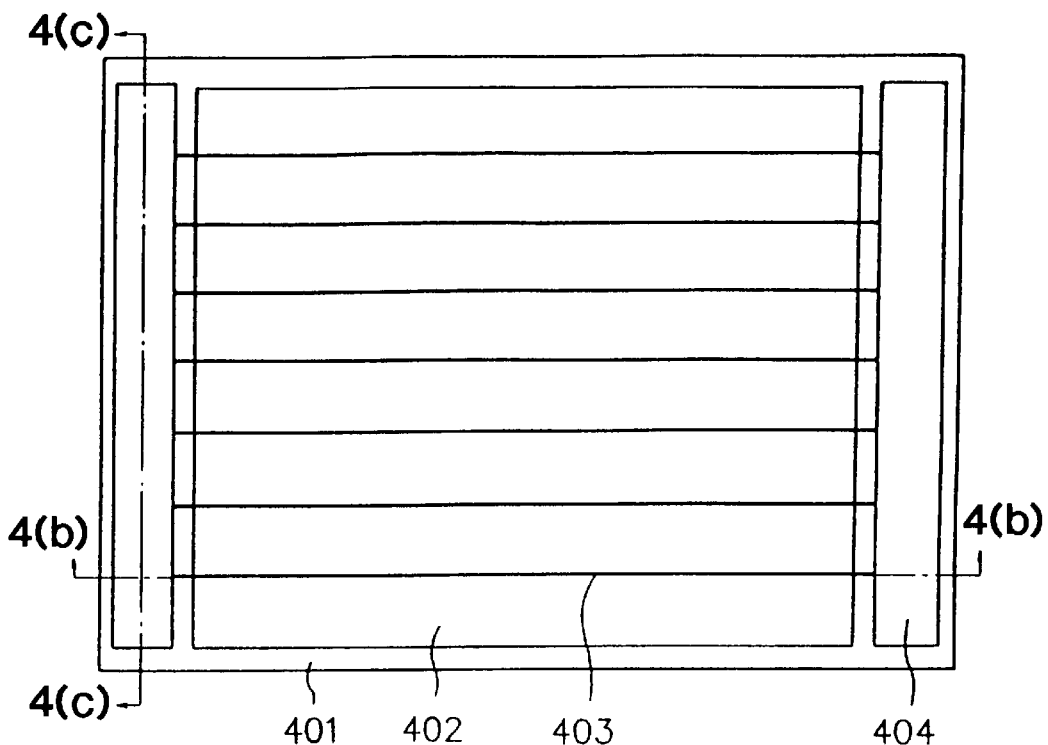
FIG. 4(a) is a schematic plan view illustrating another example of a photovoltaic device according to the present invention.
Figure 4B:
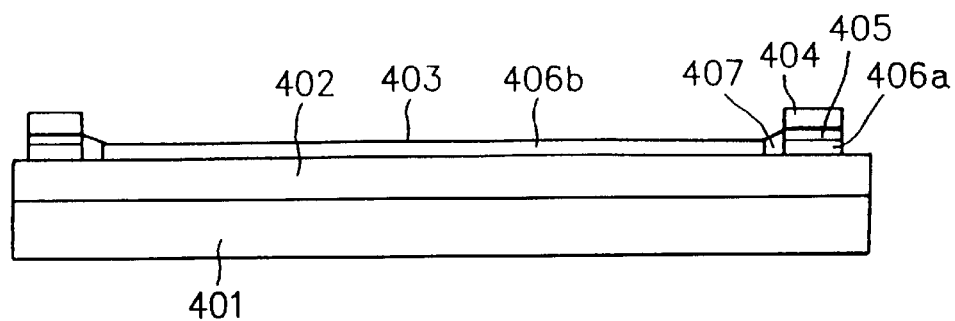
FIG. 4(b) is a schematic cross-sectional view, taken along the line A–A' in FIG. 4(a).
Figure 4C:
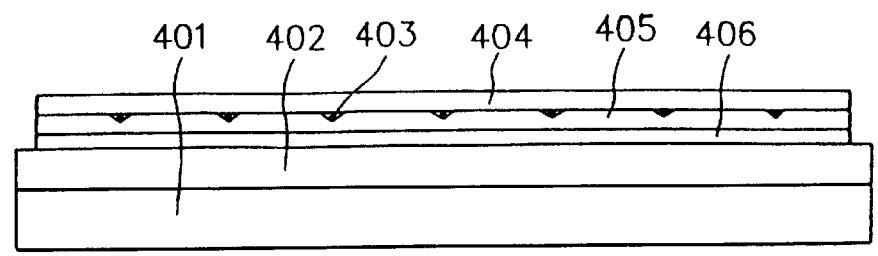
FIG. 4(c) is a schematic cross-sectional view, taken along the line B–B' in FIG. 4(a).

FIG. 4(a) is a schematic plan view illustrating another example of a photovoltaic device according to the present invention. FIG. 4(b) is a schematic cross-sectional view, taken along the line A–A' in FIG. 4(a). FIG. 4(c) is a schematic cross-sectional view, taken along the line B–B' in FIG. 4(a).

In FIGS. 4(a) through 4(c), reference numeral 401 indicates a substrate having an electrically conductive surface, reference numeral 402 a photovoltaic device (comprising a photoelectric conversion semiconductor layer) formed on the entire electrically conductive surface of the substrate 401, and reference numeral 406 a transparent and electrically conductive layer as an upper electrode formed on the surface of the semiconductor layer of the photovoltaic element 402.

Reference numeral 403 indicates a metallic wire 403 as a first collecting electrode, reference numeral 404 a bus bar as a second collecting electrode, and reference numeral 405 an adhesive body.

Reference numeral 407 indicates a region with no transparent and electrically conductive layer, which is formed by removing each of opposite side partial portions of the transparent and electrically conductive layer 406 by way of etching or the like to establish a power-generating layer region 406b of the transparent and electrically conductive layer 406 (which effectively works for power generation) and opposite electrically isolated non-power generating regions 406a of the transparent and electrically conductive layer 406 (each of which serves as a portion for disposing a bus bar 404 thereon). This electrode structure is effective in further ensuring electrical insulation between the electrode (the lower electrode) on the substrate side and the bus bar 404.

An adhesive body 404 is arranged and fixed on each of the opposite non-power generating regions 406a. A plurality of metallic wires 403 (which may be provided with an electrically conductive adhesive such a way as described in the case of the photovoltaic device shown in FIGS. 1(a) through 1(c)) are spacedly arranged so as to situate on the power generating region 406b and the opposite non-power generating regions 406a, wherein the opposite end portions of each metallic wire 403 are fixed by means of the adhesive bodies 105. A bus bar 404 comprising a metal body is arranged on each of the opposite adhesive bodies 405 so as to sandwich the metallic wires 403 between the bus bars 404 and the adhesive bodies 405, wherein the bus bars 404 are also fixed by means of the adhesive bodies 405.

As shown in FIG. 4(c), the metallic wires 403 are arranged such that their end portions are embedded in the adhesive body 405 while being sandwiched between the adhesive body 405 and the bus bar 404, wherein the bus bar 404 is also contacted with the adhesive body 405.

This embodiment shown in FIGS. 4(a) through 4(c) is suitable particularly in the case of using a photovoltaic element formed on a long substrate.

Figure 5:
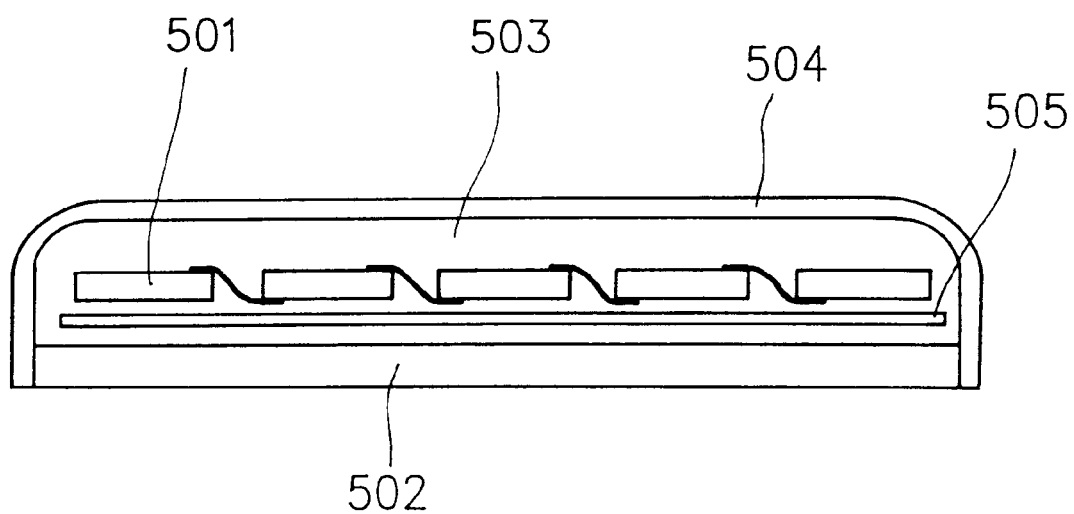
FIG. 5 is a schematic cross-sectional view illustration an example of a solar cell module in which a plurality of photovoltaic devices according to the present invention are integrated in series connection.

FIG. 5 is a schematic cross-sectional view illustrating an example of a solar cell module in which a plurality of photovoltaic devices according to the present invention are integrated in series connection.

Particularly, the solar cell module shown in FIG. 5 comprises an integrated body comprising a plurality of photovoltaic devices 501 according to the present invention integrated in series connection is sealed together with an electrically insulating film 505 disposed on the rear side of the integrated body on a back face reinforcing member 502 by means of a sealing resin 503, and an exposed exterior of the resin sealed body is covered by a surface protective layer 504.

Specific examples of the electrically insulating film 505 are nylon film, PET film and the like.

Specific examples of the back face reinforcing member 502 are metal plate, plastic plate, glass plate and the like.

As the sealing resin 503, it is desired to use a resin excelling in weatherability, adhesion, packing property, heat resistance, cold resistance and impact resistance. As such resin, there can be mentioned, for example, EVA (ethylene-vinyl acetate copolymer), EEA (ethylene-ethyl acrylate copolymer), and the like.

It is desired for the surface protective layer to be constituted by a transparent fluororesin in order for the solar cell module to be of light weight and to have flexibility. Specific example of such fluororesin are ETFE (ethylene-tetrafluoroethylene copolymer) such as TEFZEL (trademark name, produced by Du Pont Company), polyvinyl fluoride such as TEDLAR (trademark name, produced by Du Pont Company), and the like. The fluororesin by which the surface protective layer is constituted may contain an UV absorber in order to improve the weatherability thereof.

The resin sealing of the above integrated body may be conducted in a conventional lamination manner using a vacuum laminater, where thermocompression bonding is conducted in a vacuumed atmosphere.

In the case where a light transmissive member such as a glass plate is used as the substrate, the light transmissive member may be used as the surface protective layer. In this case, the foregoing integrated body of the photovoltaic devices is sealed by the foregoing sealing resin, and the rear side is protected by a film of the foregoing fluororesin or a film of PET (poly(ethylene-terephthalate)).

It is possible for a solar cell module having such configuration as shown in FIG. 5 according to the present invention to be made into a solar cell-integrated construction member usable as a roofing member or walling member by properly bending one or both opposite end portions of the back face reinforcing member.

Figure 7A:
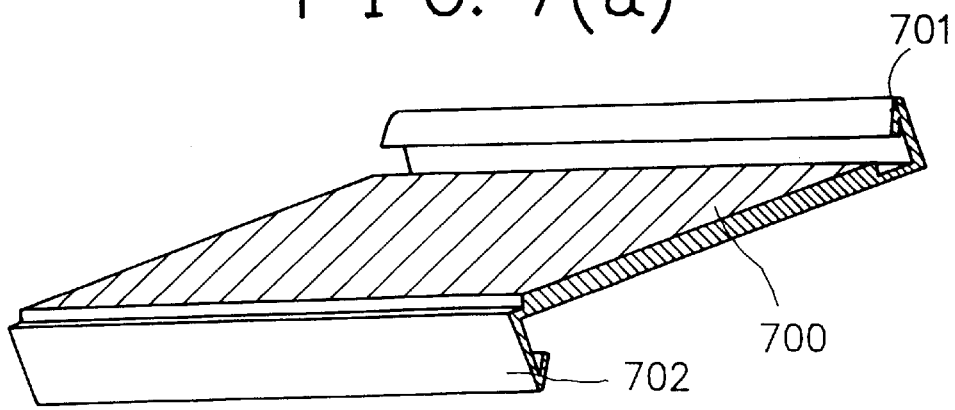
FIGS. 7(a) through 7(c) are schematic explanatory views respectively illustrating an embodiment of using a solar cell module comprising a photovoltaic device according to the present invention as a construction member.
Figure 7B:
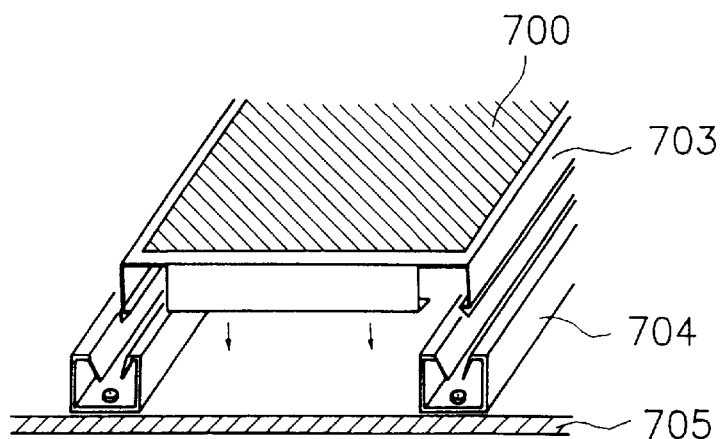
Figure 7C:
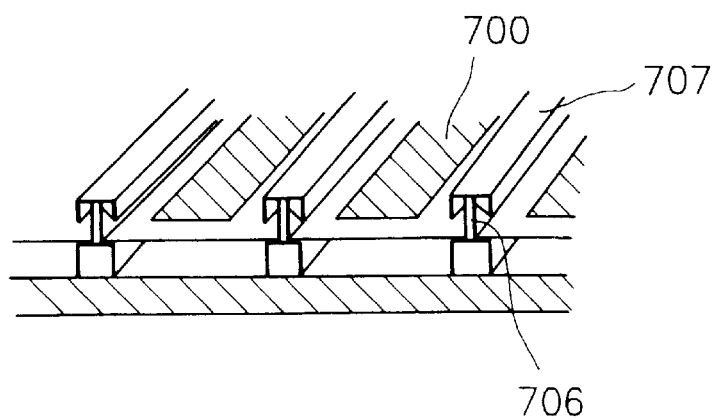

The solar cell-integrated construction member herein may be designed as shown in FIGS. 7(a), 7(b) or 7(c).

FIG. 7(a) is a schematic explanatory view illustrating a roofing member comprising a plane portion 700 having a photovoltaic device according to the present invention disposed therein and which is provided with a fastening portion 701 on a ridge side and another fastening portion 702 on an eaves side.

FIG. 7(b) is a schematic explanatory view illustrating another roofing member comprising a plane portion 700 having a photovoltaic device according to the present invention disposed therein and which is provided with fastening portions 703 to be engaged with anchors 704 secured on a roof board 705.

FIG. 7(b) is a schematic explanatory view illustrating another roofing member comprising a plurality of roofing members each having a plane portion 700 containing a photovoltaic device according to the present invention and having two fastening portions 706, where each adjacent roofing members are integrated by securing their fastening portions by means of capping members 707 as shown in FIG. 7(c).

Further, it is possible for a solar cell module having such configuration as shown in FIG. 5 according to the present invention to be used as a power supply source.

Figure 6:
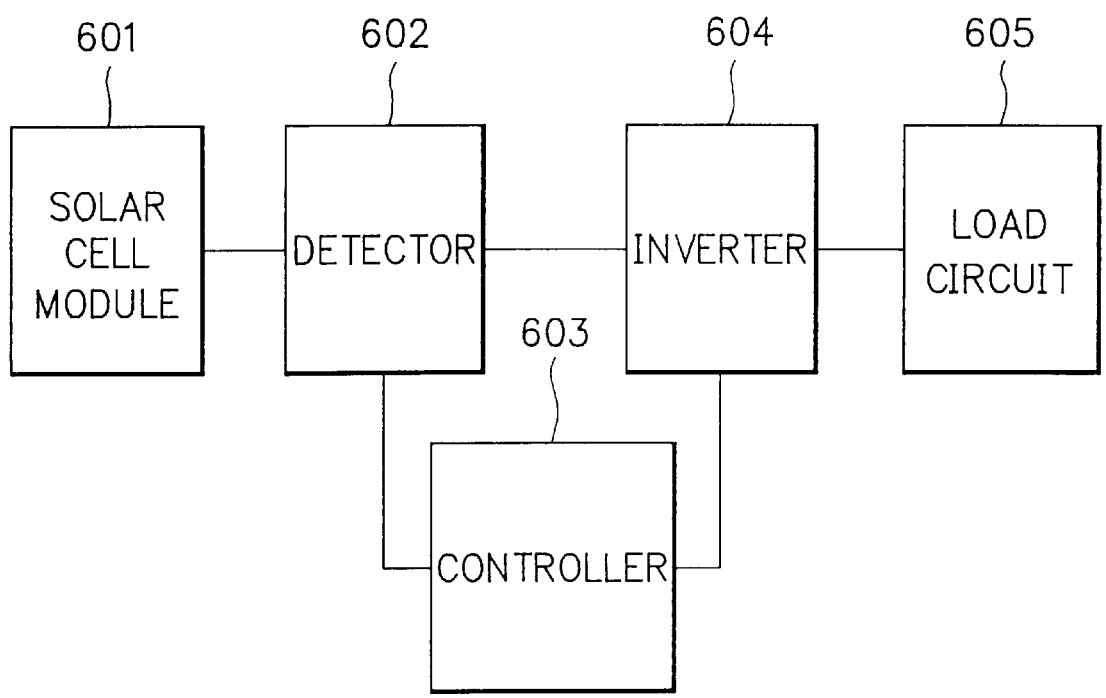
FIG. 6 is a schematic diagram illustrating a power conversion apparatus in which a solar cell module comprising a photovoltaic device according to the present invention is used.

FIG. 6 is a schematic diagram illustrating a power conversion apparatus as an example in the case of using the solar cell module according to the present invention as a power supply source.

The power conversion apparatus shown in FIG. 6 comprises the solar cell module 601 according to the present invention, a detector 602 for detecting a voltage and an electric current of the solar cell module, a controller 603, and an inverter 604. The controller 603 herein serves to control the inverter 604 depending on an output detected by the detector. The power conversion apparatus is also provided with a load circuit 605 connected to the inverter 604. The power generated by the solar cell module 601 is supplied into the load circuit 605 through the above mechanism of the power conversion apparatus. The power conversion apparatus may be provided with a linkage function to a commercial electric power system.

In the following, description will be made of each constituent of the photovoltaic device according to the present invention with reference to FIGS. 2(a) and 2(b).

Adhesive Body 202

As the adhesive body 202 which is disposed on the metallic wire-fixing region 201 and which serves to fix the metallic wire 205 and the bus bar 207, there is used a stacked body comprising a heat resistant polymer film 203 having opposite surfaces each having an adhesive material 204 stacked thereon. The stacked body can include so-called double-coated tapes and other laminate products comprising a plurality of polymer films and a plurality of adhesive layers which are alternately stacked such that each of the top and bottom layers comprises an adhesive layer. For the laminate product, it is possible to use a plurality of different kind heat resistant polymer films or a plurality of different kind adhesive layers.

As a specific example of such double-coated tape or laminate product usable as the adhesive body 202, there can be mentioned a commercially available double-coated tape DOUBLE FACE LEW411A (having a width of 7 mm) (trademark name, produced by Toyo Ink Kabushiki Kaisha), comprising a 0.050 mm thick adhesive layer of polydimethylsiloxane/a 0.025 mm thick polymer film of polyimide/a 0.025 mm thick adhesive layer of polydimethylsiloxane/a 0.075 mm thick polymer film of polyester/a 0.050 mm thick adhesive layer of polydimethylsiloxane.

Polymer Film 203

The polymer film 203 is used together with the adhesive 204 as a part of the adhesive body 202 in order to dispose the metallic wire 205 or the bus bar 207 on the photovoltaic element. The polymer film 203 is desired to be heat resistant for the purpose of protecting the photovoltaic element from being damaged by heat of a solder, or bur or fracture of the bus bar upon connecting the metallic wire 205 or a by-pass diode to the bus bar 207. In addition, the polymer film 203 is desired to have an electrically insulating property in order to prevent the metallic wire 205 from being short-circuited with the lower electrode on the substrate side.

The polymer material by which the polymer film 203 is constituted can include cellophane, rayon, acetate, polyethylene, polyethylene terephthalate, polyether ketone, fluororesin, polysulfone, unsaturated polyester, epoxy resin, polyamide resin, polyimide resin, polyamide-imide resin, and polyimide-silicone resin. Of these, polyimide resin and polyethylene terephthalate are the most appropriate in terms of adhesion with the adhesive 204, low thermal expansion, and physical strength.

The polymer film 203 is desired to have a melting point of 250° C. or above.

Adhesive Material 204

The adhesive material 204 (or the adhesive material layer) may comprise one or more adhesive materials selected from the group consisting of acrylic adhesive materials, rubber series adhesive materials, silicone series adhesive materials, polyvinyl ether series adhesive materials, expoxy series adhesive materials, polyurethane series adhesive materials, nylon series adhesive materials, polyamide series adhesive materials, inorganic adhesive materials, and composite type adhesive materials. Of these, those satisfactory in adhesion, tuck, holding power, anti-static property, heat resistance and moisture resistance are desirably used. Acrylic adhesive materials and silicone series adhesives are particularly more appropriate since they excel in durability, holding power, and heat resistance. Of these, silicone series adhesive materials are the most appropriate since they are desirably low in moisture absorption and excels in moisture resistance.

The formation of an adhesive material layer as the adhesive material 204 may be conducted in a manner of forming a coat layer having a uniform width using an applicator or the like, wherein after-treatment such as drying treatment, heat treatment, compression treatment, or light irradiation treatment may be conducted for the resulting coat layer depending upon the kind of an adhesive material used.

The adhesive material 204 is desired to be designed such that it has a hygroscopicity preferably in the range of 0.0% to 1.5%, more preferably in the range of 0.01% to 1.0% or less when maintained in an atmosphere of 40° C./80% RH for 12 hours. In this case, it is possible to desirably attain the formation of a resin seal having a defect-free good exterior appearance for a photovoltaic device in the resin sealing process.

Metallic Wire 205

The metallic wire 205 used as a first collecting electrode for a photovoltaic device is desired to be constituted by a metal or alloy having a low electric resistance. Such metal can include, for example, Cu, Ag, Au, Pt, Al, Mo, and W and such alloy can include, for example, alloys of these metals.

It is possible for the metallic wire 205 to have a thin surface protective metal layer formed on the surface thereof for the purposes of preventing it from corroding or oxidizing, improving its adhesion with an electrically conductive resin, and improving its electrical conductivity.

The surface protective metal layer is desired to be constituted by a metallic material which is difficult to be corroded or excels in corrosion resistance. Specific examples of such metallic material are Ag, Pd, Ag-Pd alloy, Au, Ni, and Sn.

The surface protective metal layer may be formed by way of plating or cladding.

Alternatively, the surface protective metal layer may be a coat layer formed by using an electrically conductive resin composition comprising particles of the foregoing metallic material dispersed in a binder resin. In this case, the thickness of the coat layer should be properly determined depending upon the situation involved. For instance, when the metallic wire 205 has a circular cross section, it is desired for the coat layer to have a thickness corresponding to 1 to 10% of the diameter of the circular cross section of the metallic wire.

The metallic wire 205 is desired to of a circular cross section. But it may be of a cross section in other form such as rectangular form depending upon the situation involved.

For the diameter of the metallic wire 205, it should be properly designed so that the sum of a loss of electric resistance and a shadow loss is minimized. Specifically, it is preferably in the range of 25 $\mu$m to 1 mm, more preferably in the range of 25 $\mu$m to 200 $\mu$m. In the case where the diameter is less than 25 $\mu$m, the metallic wire is liable to entail problems such that it is sometimes broken and a relatively large electricity loss is caused. In the case where the diameter is beyond 200 $\mu$m, there are problems such that the shadow loss (which means an area occupied by the metallic wire over the surface of the photovoltaic element) is increased, and irregularities which are undesirably large in size are established on the surface of the photovoltaic element and because of this, it is necessary to thicken the thickness of a resin seal by means of a sealing resin such as EVA to be formed in the resin sealing by means of vacuum lamination or the like.

Such a metallic wire as the metallic wire 205 may be prepared by means of a conventional wire drawing machine capable of producing a metallic wire having a desired diameter. The metallic wire produced by the wire drawing machine is hard. Therefore, in order to make the hard metallic wire have a reasonable extensibility and bendability, it may be softened by subjecting to annealing treatment.

Electrically Conductive Adhesive 206

The electrically conductive adhesive 206 which is disposed on the surface of the metallic wire 205 while contacting with the bus bar 207 functions to efficiently collect a photovoltaic force, whereby making the photovoltaic device exhibit desirable photovoltaic characteristics.

In order to dispose the electrically conductive adhesive on the surface of the metallic wire 205 (see, FIG. 2(a)), a given electrically conductive adhesive composition is applied on the entire surface or a desired partial surface area of the metallic wire 205 by means of a conventional coating process, followed by subjecting to thermocompression treatment.

Besides this, as shown in FIG. 2(b), the electrically conductive adhesive 206 may be disposed on the side of the bus bar 207 so that the metallic wire 206 is electrically connected to the bus bar 207 through the electrically conductive adhesive. In this case, it is possible that prior to electrically connecting the metallic wire 205 to the bus bar 207, a adhesive coat layer is formed on a surface of the bus bar 207 to be contacted with the metallic wire 205 by applying a given electrically conductive adhesive composition on said surface of the bus bar 207, the bus bar having said adhesive coat is superpose on the metallic wire, followed by subjecting to thermocompression treatment.

In any case, the electrically conductive adhesive 206 for bonding the metallic wire 205 to the bus bar 207 comprises an electrically conductive composition comprising electrically conductive particles of an electrically conductive material dispersed in a binder resin. As the binder resin, it is desired to use a polymer resin which enables to readily form a coating film on the surface of the metallic wire, excels in heat resistance and workability, and has flexibility. Such polymer resin can include heat-curable resins and thermoplastic resins.

Specific examples of the heat-curable resin are epoxy resins, urethane resins, phenol resins, polyvinyl formals, alkyd resins, and modified resins of these resins. Of these, urethane resins are particularly desirable because they often have being used as an insulating coating material for an enameled wire and excel in flexibility and also in productivity.

Specific examples of the thermoplastic resin are polyamide resins, melamine resins, butyrals, phenoxy resins, polyimide resins, fluororesins, acrylic resins, styrene resins, and polyester resins.

The electrically conductive material for the electrically conductive particles dispersed in the binder resin can include pigments capable of imparting electrically conductivity. Specific example of such pigment are graphite, carbon black, metal oxides such as $In_2O_3$, $TiO_2$, $SmO_2$, ITO and ZnO, oxide semiconductors comprising these metal oxides added with a dopant.

It is necessary for the electrically conductive particles to have a mean particle size which is smaller than the thickness of an electrically conductive adhesive layer as the electrically conductive adhesive 206. When the mean particle size is excessively small, there entails a problem in that the resistance at a contact point among the electrically conductive particles becomes excessively large so that a desired resistivity cannot be obtained. In this respect, the electrically conductive particles are desired to have a mean particle size in the range of 0.02 $\mu$m to 15 $\mu$m.

The electrically conductive particles are mixed with the foregoing polymer resin at an appropriate mixing ratio so that a desired resistivity can be obtained. In the case where the content of the electrically conductive particles is made to be excessively large, there can be obtained a low resistivity, but a drawback entails in that since the content of the polymer resin is undesirably small, it is difficult to form a coating film having desired stability.

In the case where the content of the polymer resin is made to be excessively large, the electrically conductive particles are difficult to be contacted with each other as desired, resulting in an excessive increase in the resistance.

Therefore, for the mixing ratio between the electrically conductive particles and the polymer resin, it should be adequately determined depending upon the kind of electrically conductive particles used and that of a polymer resin used and also depending upon the physical properties of these. Specifically, there can be attained a desirable resistivity by making the electrically conductive particles to be in the range of 5 volume % to 95 volume %.

The electrically conductive adhesive 206 is necessary to be designed to have such a thickness that its resistivity can be disregarded in collecting an electric current generated by the photovoltaic element and a shunt, which will be a cause of entailing migration of a metal ion from the metallic wire 205, is not occurred. Specifically, it is desired that the electrically conductive adhesive 206 is designed to have a thickness exhibiting a shunt resistance of 0.01 $\Omega$.cm to 100 $\Omega$.cm for the following reasons. That is, when the shunt resistance of the electrically conductive adhesive 206 is less than 0.01 $\Omega$.cm, it is inferior in barrier function for preventing occurrence of a shunt. And when the shunt resistance of the electrically conductive adhesive is beyond 100 .cm, the loss in electric resistance is increased.

The preparation of a desirable electrically conductive composition comprising the foregoing electrically conductive particles dispersed in the foregoing polymer resin for the formation of the electrically adhesive 206 may be conducted using a conventional dispersing apparatus such as triple roll mill, paint shaker, or beads mill. In order to facilitate the dispersion of the electrically conductive particles in the polymer resin, it is possible to use an appropriate dispersant. Further, during or after the dispersing operation, it is possible to add an appropriate solvent in order to adjust the viscosity of the polymer resin.

Bus Bar 207

As previously described, the bus bar 207 is disposed over the metallic wire's end portion-fixing surface region 201.

The metallic wire's fixing surface region 201 (which means one of opposite edge portions of the surface of the photovoltaic element where an end portion of the metallic wire 205 is fixed) includes the following embodiments.

(i) An exposed region of a substrate of a photovoltaic element having a photoelectric conversion semiconductor layer.

(ii) A region formed by removing a part of a transparent and electrically conductive layer (as an upper electrode layer) formed on the outermost surface of the photovoltaic element.

(iii) A region comprising a part of the transparent and electrically conductive layer formed on the outermost surface of the photovoltaic element where said part is not electrically connected with the photoelectric conversion semiconductor layer of the photovoltaic element.

The bus bar 207 is constituted by a metallic material having a low electric resistance such as a metal or metal alloy.

Specific examples of such metallic material are metals such as Cu, Ag, Au, Pt, Al, Sn, Pb and Ni, and alloys of these metals.

It is possible for the bus bar 207 to have a thin surface protective metal layer formed on the surface thereof to be electrically connected with the metallic wire 206 for the purposes of preventing it from corroding or oxidizing, improving its adhesion with an electrically conductive resin, and improving its electrical conductivity as well as in the case of the metallic wire 205.

The surface protective metal layer may be formed by way of plating or cladding as well as in the case of the metallic wire 205.

Alternatively, it is possible that an electrically conductive paste is applied on at least a part of the surface of the bus bar 207 to be electrically connected with the metallic wire 205 such that the bus bar is electrically connected to the metallic wire through the electrically conductive paste.

The bus bar 207 may be shaped in a web-like foil form or a wire form.

In the following, description will be made of a photovoltaic element used in the present invention, while referring to FIGS. 1(a) through 1(c).

The photovoltaic element 102 used in the present invention is desired to comprise a substrate 101, a first electrode (or a lower electrode) disposed on said substrate, a photoelectric conversion semiconductor layer (which contributes to power generation) disposed on said first electrode, and a second electrode (comprising a metallic wire) disposed on a light receiving surface of said photoelectric conversion semiconductor layer.

If necessary, it is possible to dispose a transparent and electrically conductive layer between the photoelectric conversion semiconductor layer and the second electrode for light reflection preventive purpose.

The first electrode is disposed on the rear side of the photoelectric conversion semiconductor layer as above described. The first electrode may comprise a metallic layer formed, for instance, by way of screen printing or vacuum deposition. The metallic layer in this case may be constituted by an adequate metallic material capable of providing a good ohmic contact with the photoelectric conversion semiconductor layer.

For the photoelectric conversion semiconductor layer, when it comprises an amorphous material film such as an amorphous silicon film (an a-Si film), it is necessary to have a substrate for retaining said amorphous material film. As the substrate, an electrically conductive member or an electrically insulating member having an electrically conductive surface may be used. In this case, the first electrode is formed on the substrate.

The first electrode may comprise a metallic member constituted by, for instance, stainless steel or aluminum. Besides, the first electrode may comprise an electrically insulating member (constituted by, for instance, glass, polymer resin, or ceramics) having an electrically conductive surface composed of an electrically conductive material such as Cu, Al, or Ag formed, for instance, by way of vacuum deposition.

In the case where the photovoltaic element is a crystal silicon series photovoltaic element, the fist electrode may be formed by way of screen printing using an Ag-paste, without using the substrate.

In the case where the foregoing metallic layer as the first electrode is formed on an electrically insulating substrate constituted by a resin or the like, an end portion of the first electrode on the substrate, which corresponds a non-power generation region where the bus bar 104 is arranged, may be removed in order to ensure electrical insulation between the upper and lower electrodes.

The photoelectric conversion layer is necessary to have a structure with a semiconductor junction such as pn junction, pin junction, Schottky junction or the like.

Specifically, the photoelectric conversion semiconductor layer having such semiconductor junction is constituted by an adequate semiconductor material. As such semiconductor material, there can be illustrated semiconductor materials comprising an element belonging to group IV of the periodic table such as single crystalline silicon semiconductor material, polycrystalline silicon (poly-Si) semiconductor material, amorphous silicon (a-Si) semiconductor material, and microcrystalline silicon ($\mu$c-Si) semiconductor material; semiconductor conductor materials comprising elements belonging to groups II and VI of the periodic table such as CdS semiconductor material and CdTe semiconductor material; and semiconductor materials comprising elements belonging to groups III and V of the periodic table such as GaAs semiconductor material and the like.

The photoelectric conversion layer may comprise a single cell structure comprising a single cell with a pn or pin junction, a tandem cell structure comprising two cells having a pn or pin junction being stacked, or a triple cell structure comprising three cells having a pn or pin junction being stacked.

Specifically, the tandem cell structure can include, for example, a stacked cell structure comprising a bottom cell with a pin junction and a top cell with a pin junction being stacked wherein each of the two cells comprises an n-type semiconductor layer, an i-type semiconductor layer (comprising an a-Si semiconductor layer) and a p-type semiconductor layer being stacked; and a stacked cell structure comprising a bottom cell with a pin junction and a top cell with a pin junction being stacked wherein the bottom cell comprises an n-type semiconductor layer, an i-type semiconductor layer (comprising an a-SiGe semiconductor layer) a p-type semiconductor layer being stacked, and the top cell comprises an n-type semiconductor layer, an i-type semiconductor layer (comprising an a-Si semiconductor layer) and a p-type semiconductor layer being stacked. In any of these stacked cell structure, it is possible for the bottom cell to be of a two-layered structure with a pn junction comprising a polycrystalline semiconductor material.

For the triple cell structure, it can include, for example, a stacked cell structure comprising a bottom cell with a pin junction, a middle cell with a pin junction and a top cell with a pin junction being stacked wherein each of the three cells comprises an n-type semiconductor layer, an i-type semiconductor layer and a p-type semiconductor layer being stacked, the i-type semiconductor layer in each of the middle and top cells comprises an a-Si semiconductor layer, and the i-type layer in the bottom cell comprises an a-SiGe semiconductor layer; and a stacked cell structure comprising a bottom cell with a pin junction, a middle cell with a pin junction and a top cell with a pin junction being stacked wherein each of the three cells comprises an n-type semiconductor layer, an i-type semiconductor layer and a p-type semiconductor layer being stacked, the i-type semiconductor layer in the top cell comprises an a-Si semiconductor layer, and the i-type layer in each of the middle and bottom cell comprises an a-SiGe semiconductor layer.

In any of the above stacked cell structure, the semiconductor layer of p- or n-type situated on the light incident side may be constituted by a microcrystalline ($\mu$c-) semiconductor material.

It should be understood that the photoelectric conversion layer of the photovoltaic element is not limited to these embodiments.

The transparent and electrically conductive layer is constituted by an appropriated transparent and electrically conductive material. Specific examples of such transparent and electrically conductive material are ITO, $SnO_2$, $In_2O_3$, and the like.

The second electrode comprising the metallic wire is disposed on the light incident face side of the photoelectric conversion semiconductor layer as previously described. As the the metallic wire as the first collecting electrode, a plurality of metallic wires are used, and it is desired for them to be spacedly arranged at a desired interval and in parallel to each other so that the sum of the electric resistance by the metallic wires and the shadow loss due to the metallic wires is minimized. For instance, when the sheet resistance of the transparent and electrically conductive layer is about 100 $\Omega/_\square$, the metallic wires are desired to be spacedly arranged at an interval of about 5 mm. When a plurality of metallic wires having a relatively small diameter are used, it is desired that they are spacedly arranged at a small interval, and when a plurality of metallic wires having a relatively large diameter are used, it is desired that they are spacedly arranged at a large interval, in order to optimize their arrangement situation.

In the following, description will be made of the production of a photovoltaic device according to the present invention.

A photovoltaic device according to the present invention may be produced, for example, in the following manner.

A photovoltaic element comprising a photoelectric conversion semiconductor layer formed on an electrically conductive surface of a substrate and a transparent and electrically conductive layer formed on the photoelectric conversion semiconductor layer is provided. Part of the transparent and electrically conductive layer situated in the periphery of the photovoltaic element is removed using an adequate etching paste, whereby (a) a power generation region comprising the transparent and electrically conductive layer and (b) opposite non-power generation peripheral regions each comprising an exposed portion of the photoelectric conversion semiconductor layer which is situated outside said power generation region (a) are established on the photovoltaic element. On each of the opposite non-power generation regions (b), any of the foregoing adhesive body is arranged and bonded. A plurality of metallic wires coated by an electrically conductive adhesive are spacedly arranged at a desired interval on the photovoltaic element and their end portions are bonded on the opposite adhesive bodies. A bus bar (comprising, for example, a hard copper member coated by an Ag-clad) is arranged and bonded on each of the opposite adhesive bodies while electrically connecting to the metallic wires. In order to bond the metallic wires on the cell face (that is, the power generation region (a) of the photovoltaic element, the resultant is subjected to thermocompression treatment, for instance, under conditions of 200° C. for the temperature, 1 Kg/cm$^2$ for the pressure, and one minute for the treatment period of time. In order to improve the adhesion between the metallic wires and the bus bars, the resultant is subjected to thermocompression treatment, for instance, under conditions of 200° C. for the temperature, 5 Kg/cm$^2$ for the pressure, and 15 second for the treatment period of time.

By this, there can be a desirable photovoltaic device according to the present invention.

In the following, the present invention will be described in more detail with reference to examples which are only for illustrative purposes and not intended to restrict the scope of the present invention.

EXAMPLE 1

In this example, there was prepared a solar cell module in which a photovoltaic device having the configuration shown in FIGS. 4(a) through 4(c) is used.

The solar cell module was prepared in the following manner.

1. Preparation of collecting electrode:

As the metallic wire 403 which serves as a collecting electrode, a coated metallic wire having the cross section shown FIG. 2(a) comprising a metallic wire 205 as a core and an electrically conductive adhesive 206 as a coat layer (or a clad) was prepared in the following manner.

(1) As the metallic wire, there was provided a silver clad copper wire of 100 μm in diameter comprising a copper wire applied with a silver clad of 2 μm in thickness.

(2) There was prepared an electrically conductive paste to be used for coating the silver clad copper wire as follows. A mixed solvent composed of 2.5 g of ethyl acetate and 2.5 g of isopropyl alcohol (IPA) was introduced into a dispersing and shaking vessel, followed by sufficiently stirring by means of a ball mill. Then, 1.1 g of a blocked isocyanate as a curing agent and 10 g of dispersing glass beads were added into the dispersing and shaking vessel. Thereafter, 2.5 g of a carbon black powder having a average primary particle size of 0.05 μm (as an electrically conductive material) to the mixture in the dispersing and shaking vessel. Then, the dispersing and shaking vessel was shaken for 10 hours by means of a paint shaker (produced by Tohyoseiki Seisakusho Kabushiki Kaisha) to produced a paste in which the fine particles of the carbon black as the electrically conductive material are well dispersed in the dispersing and shaking vessel. The resultant paste was taken out from the dispersing and shaking vessel, and the dispersing glass beads were removed from the paste. By this, there was obtained a electrically conductive paste.

A sample of the resultant electrically conductive paste was subjected to measurement of average particle size. As a result, the electrically conductive paste was found to have an average particle size of about 1 um. In addition, said sample was subjected to heat curing at 160° C. for 30 minutes (which are standard curing conditions for the curing agent comprising the blocked isocyanate) to obtain a cured product, and for the cured product, its volume resistivity was measured. As a result, the cured product was found to have a volume resistivity of 10 Ω.cm. This means that the cured product has a sufficiently low resistance.

(3) The metallic wire comprising the silver clad copper wire provided in the above step (1) was coated by the electrically conductive paste obtained in the above step (2) using a conventional wire coater with a coating die of 150 μm to 200 μm in bore size in the following manner. The metallic wire wound on a pay-out reel was delivered and the metallic wire delivered was successively taken up on a take-up reel, where the wire coater was operated to apply the electrically conductive paste to the metallic wire moving from the pay-out reel toward the take-up reel, followed by drying, under conditions of 40 m/min., 2 seconds for residence time and 120° C. for drying temperature. This procedure was repeated 5 times.

By this, there was obtained a wire product having a core comprising the silver clad copper wire which is coated by an electrically conductive adhesive coat layer. Herein, the electrically conductive adhesive coat layer formed on the silver clad copper wire was found to be in a non-cured state which is free of the solvent.

The resultant wire product was cut to obtain a plurality of collecting electrodes as the metallic wire 403.

2. Preparation of photovoltaic element:

As the photovoltaic element 402, there was provided a pin junction triple cell type photovoltaic element prepared in the following manner.

There was provided a cleaned plate made of SUS430BA (stainless steel) of 125 um in thickness as the substrate 401. On the substrate, there was formed a two-layered lower electrode layer comprising a 5000 Å thick Ag film and a 5000 Å thick ZnO film by means of a conventional sputtering process.

Successively, on the lower electrode layer, there was formed a photoelectric conversion semiconductor layer having a bottom cell comprising a 400 Å thick n-type a-Si film/a 1000 Å thick i-type a-SiGe film/a 100 Å thick p-type μc-Si film, a middle cell comprising a 400 Å thick n-type a-Si film/a 900 Å thick i-type a-SiGe film/a 100 Å thick p-type μc-Si film, and a top cell comprising a 100 Å thick n-type a-Si film/a 1000 Å thick i-type a-Si film/a 100 Å thick p-type μc-Si film being stacked in the named order from the substrate side by means of a conventional plasma CVD process, where the n-type a-Si film in each of the three cells was formed from a mixture of $SiH_4$ gas, $PH_3$ gas and $H_2$ gas; the p-type uc-Si film in each of the three cells was formed from a mixture of $SiH_4$ gas, $BF_3$ gas and $H_2$ gas; the i-type a-SiGe film in each of the bottom and middle cells was formed from a mixture of $SiH_4$ gas, $GeH_4$ gas and $H_2$ gas; and the i-type a-Si film in the top cell was formed from a mixture of $SiH_4$ gas and $H_2$ gas.

Then, on the p-type uc-Si film of the top cell of the photoelectric conversion semiconductor layer, there was formed a 700 Å thick ITO film as a transparent and electrically conductive layer by means of a conventional heat resistance evaporation process.

By this, there was obtained a photovoltaic element used as the photovoltaic element 402. The photovoltaic element was found to a square area 30 cm×30 cm in size with respect to the photoelectric conversion semiconductor layer.

3. Preparation of photovoltaic device:

(1) For the photovotaic element obtained in the above step 2, using an etching paste containing ferric chloride as a main component and a conventional printing machine, part of the transparent and electrically conductive layer was removed to form two regions 407 free of the transparent and electrically conductive layer such that a square power generation active area of 900 $cm^2$ was established between the two regions 407, and a power generation transparent and electrically conductive layer region 406b situated over the square effective area and opposite non-power generation transparent and electrically conductive layer regions 406a respectively situated outside the corresponding region 407.

(2) On each of the two transparent and electrically conductive layer regions 406a, an adhesion body 405 comprising a stacked body comprised of a 50 μm thick silicone adhesive layer/a 25 μm thick polyimide film layer/a 25 μm thick silicone adhesive layer/a 75 μm thick polyethylene terephthalate film layer/a 50 μm thick silicone adhesive layer was positioned and bonded thereon. Then, on the entire surface of the photovoltaic element, the collecting electrodes 403 obtained in the above step 1 were arranged at an equal interval of 5.5 mm, followed by fixing their end portions onto the adhesive bodies 405. Thereafter, a copper foil covered by a silver clad and having a width of 7 mm in width as the bus bar 404 was arranged on each end portion of the photovoltaic element so as to cover the collecting electrodes 403 and the adhesive body 405.

(3) The resultant obtained in the above (2) was subjected to thermocompression treatment at 200° C. and at a pressure of 1 Kg/cm$^2$ for one minute in order to bond the collecting electrodes 403 to the surface of the effective area of the photovoltaic element 402. Successively, further thermocompreesion treatment at 200° C. and at a pressure of 5 Kg/cm$^2$ was conducted for 15 seconds in order to bond the collecting electrodes 403 to the bus bars 404.

The cross section of the configuration in which the collecting electrode is bonded to the bus bar herein is as shown in FIG. 2(a).

By this, there was obtained a photovoltaic device.

The above procedures for producing a photovoltaic device were repeated to obtain 12 photovoltaic devices.

Of the resultant 12 photovoltaic devices, (i) ten of them were maintained in an atmosphere of 25° C./50% RH for 12 hours (these photovoltaic devices will be hereinafter referred to as photovoltaic devices maintained in the atmosphere (i)), (ii) one of the two remaining photovoltaic device was maintained in an atmosphere of 35° C./90% RH for 12 hours (this photovoltaic device will be hereinafter referred to as photovoltaic device maintained in the atmosphere (ii)), and (iii) the residual one photovoltaic device was reserved for evaluation of solder resistance which will be below described.

4. Preparation of solar cell module:

For each of the photovoltaic devices maintained in the atmosphere (i) and the photovoltaic device maintained in the atmosphere (ii), resin sealing was conducted in the following manner.

For each photovoltaic device, on each of the front and rear faces, a glass fiber member and a film of EVA (ethylene-vinyl acetate copolymer) were laminated in this order, followed by laminating a film of ETFE (ethylene-tetrafluoroethylene copolymer) on the EVA film on each of the front and rear faces, whereby a stacked body was obtained.

Using a conventional vacuum laminater, the stacked body was subjected to thermocompression bonding treatment at 160° C. for 60 minutes, whereby a solar cell module was obtained.

In this way, there were prepared eleven solar cell modules. The resultant solar cell modules were subjected to evaluation with respect to exterior appearance, shunt resistance, initial photoelectric conversion efficiency, and photoelectric conversion efficiency after endurance, as will be described below.

EVALUATION

1. Evaluation of solder resistance:

The photovoltaic device reserved in the above step 3 was subjected to solder resistance test in the following manner. An iron maintained at 280° C. was pressed onto the bus bar for one minute, followed by pressing another iron maintained at 320° C. onto the bus bar. Thereafter, the bus bar was peeled off from the adhesive body, and the surface state of the polymer layer of the residual adhesive body was optically observed. The observed result is shown in Table 1 based on the following criteria.

◯: a case where the surface of the polymer layer was not fused even at 320° C.,

Δ: a case where the surface of the polymer layer was partially fused at 320° C. but no fusion was occurred at the surface of the polymer layer at 280° C., and X: a case where the surface of the polymer layer was apparently fused.

2. Evaluation of exterior appearance:

For each of the solar cell module obtained using the photovoltaic devices maintained in the atmosphere (i) and the solar cell module obtained using the photovoltaic device maintained in the atmosphere (ii), its exterior appearance was optically observed. The observed results are shown in Table 1 based on the following criteria.

◯: a case where no resin seal defect such as air bubble is found, and

Δ: a case where distinguishable resin seal defects are found but these defects are practically acceptable.

3. Evaluation of shunt resistance:

For each of the ten solar cell modules respectively obtained using the photovoltaic devices maintained in the atmosphere (i), using a conventional oscilloscope, its V-I characteristics (voltage-current characteristics) in dark were measured to obtain a V-I characteristic curve. Based on the gradient near the origin of the V-I characteristic curve, a shunt resistance was obtained. In this way, there were obtained ten shunt resistances for the ten solar cell modules, and an mean value among the ten shunt resistances was obtained.

The result obtained is shown in Table 1 based on the following criteria.

◯: a case where the mean shunt resistance is beyond 200 k .cm$^2$,

Δ: a case where the mean shunt resistance is in the range of from 50 to 200 kΩ.cm$^2$, and X: a case where the mean shunt resistance is less than 50 kΩ.cm$^2$.

4. Evaluation of initial photoelectric conversion efficiency:

For each of the ten solar cell modules having been subjected to the evaluation of shunt resistance in the above evaluation 3, the solar cell module was placed in a solar simulator SPI-SUN SIMULATOR 240A (AM 1.5) (trademark name, produced by SPIRE Company), where a pseudo sunlight spectrum of 100 mW/cm$^2$ was irradiated to the solar cell module and its V-I characteristics were measured to obtain a V-I characteristic curve. Based on the V-I characteristic curve, an initial photoelectric conversion efficiency was obtained. In this way, there were obtained ten initial photoelectric conversion efficiencies for the ten solar cell modules, and an mean value among the ten photoelectric conversion efficiencies was obtained.

The mean photoelectric conversion efficiency value obtained in this example is set at 1.0 in terms of a relative vale for comparison purpose.

The result obtained is shown in Table 1 based on the following criteria.

◯: a case where the relative value is beyond 0.9, and

Δ: a case where the relative value is in the range of from 0.8 to 0.9.

5. Evaluation of photoelectric conversion efficiency after endurance:

For each of the ten solar cell modules having been subjected to the evaluation of initial photoelectric conversion efficiency in the above evaluation 4, in accordance with the temperature and humidity cycle test A-2 for crystal series solar cell modules prescribed in the JIS Standard C8917, temperature and humidity cycle test was conducted in the following manner. The solar cell module was placed in a thermo-hygrostat capable of controlling the temperature and humidity of a specimen, where the solar cell module was subjected to alternate repetition of a cycle of exposing to an atmosphere of −40° C. for an hour and a cycle of exposing to an atmosphere of 85° C./85% RH for 22 hours 20 times. After this, in the same manner as in the above evaluation 4, there was obtained a photoelectric conversion efficiency after the endurance. Thus, there were ten photoelectric conversion efficiencies for the 10 solar cell modules. And a mean value among the ten photoelectric conversion efficiencies was obtained.

Then, there was obtained a rate of change between the mean initial photoelectric conversion efficiency obtained in the above evaluation 4 and the mean photoelectric conversion efficiency after the endurance.

The result obtained is shown in Table 1 based on the following criteria.

○: a case where the rate of change is less than 2%, and

Δ: a case where the rate of change is more than 2%.

EXAMPLE 2

The procedures described in the steps 1 to 3 in Example 1 were repeated, except that the adhesive body used in the preparation of photovoltaic device (the step 3) was replaced by a adhesive body comprising a stacked body comprised of a 50 μm thick acrylic adhesive layer/a 25 μm thick polyimide film layer/a 25 μm thick acrylic adhesive layer/a 75 μm thick polyethylene terephthalate film layer/a 50 μm thick acrylic adhesive layer, to thereby obtain 12 photovoltaic devices.

Of the resultant 12 photovoltaic devices, (i) ten of them were maintained in an atmosphere of 25° C./50% RH for 12 hours (these photovoltaic devices will be hereinafter referred to as photovoltaic devices maintained in the atmosphere (i)), (ii) one of the two remaining photovoltaic device was maintained in an atmosphere of 35° C./90% RH for 12 hours (this photovoltaic device will be hereinafter referred to as photovoltaic device maintained in the atmosphere (ii)), and (iii) the residual one photovoltaic device was reserved for evaluation of solder resistance.

For each of the photovoltaic devices maintained in the atmosphere (i) and the photovoltaic device maintained in the atmosphere (ii), resin sealing was conducted in the same manner described in the step 4 of Example 1, whereby eleven solar cell modules were obtained.

EVALUATION

For the photovoltaic device reserved in the above was subjected to evaluation of solder resistance in the same manner as in Example 1.

The evaluated result obtained is shown in Table 1.

For the solar cell modules obtained in the above, evaluation was conducted with respect to exterior appearance, shunt resistance, initial photoelectric conversion efficiency, and photoelectric conversion efficiency after endurance in the same manner as in Example 1.

The evaluated results obtained are collectively shown in Table 1.

EXAMPLE 3

The procedures described in the steps 1 to 3 in Example 1 were repeated, except that the silver clad-bearing copper foil covered as the bus bar 404 in the preparation of photovoltaic device (the step 3) was replaced by a copper foil with no silver clad, to thereby obtain 12 photovoltaic devices.

Of the resultant 12 photovoltaic devices, (i) ten of them were maintained in an atmosphere of 25° C./50% RH for 12 hours (these photovoltaic devices will be hereinafter referred to as photovoltaic devices maintained in the atmosphere (i)), (ii) one of the two remaining photovoltaic device was maintained in an atmosphere of 35° C./90% RH for 12 hours (this photovoltaic device will be hereinafter referred to as photovoltaic device maintained in the atmosphere (ii)), and (iii) the residual one photovoltaic device was reserved for evaluation of solder resistance.

For each of the photovoltaic devices maintained in the atmosphere (i) and the photovoltaic device maintained in the atmosphere (ii), resin sealing was conducted in the same manner described in the step 4 of Example 1, whereby eleven solar cell modules were obtained.

EVALUATION

For the photovoltaic device reserved in the above was subjected to evaluation of solder resistance in the same manner as in Example 1.

The evaluated result obtained is shown in Table 1.

For the solar cell modules obtained in the above, evaluation was conducted with respect to exterior appearance, shunt resistance, initial photoelectric conversion efficiency, and photoelectric conversion efficiency after endurance in the same manner as in Example 1.

The evaluated results obtained are collectively shown in Table 1.

EXAMPLE 4

The procedures described in the steps 1 to 3 in Example 1 were repeated, except that the adhesive body used in the preparation of photovoltaic device (the step 3) was replaced by a adhesive body comprising a stacked body comprised of a 50 μm thick acrylic adhesive layer/a 150 μm thick polyethylene terephthalate film layer/a 50 μm thick acrylic adhesive layer, to thereby obtain 12 photovoltaic devices.

Of the resultant 12 photovoltaic devices, (i) ten of them were maintained in an atmosphere of 25° C./50% RH for 12 hours (these photovoltaic devices will be hereinafter referred to as photovoltaic devices maintained in the atmosphere (i)), (ii) one of the two remaining photovoltaic device was maintained in an atmosphere of 35° C./90% RH for 12 hours (this photovoltaic device will be hereinafter referred to as photovoltaic device maintained in the atmosphere (ii)), and (iii) the residual one photovoltaic device was reserved for evaluation of solder resistance.

For each of the photovoltaic devices maintained in the atmosphere (i) and the photovoltaic device maintained in the atmosphere (ii), resin sealing was conducted in the same manner described in the step 4 of Example 1, whereby eleven solar cell modules were obtained.

EVALUATION

For the photovoltaic device reserved in the above was subjected to evaluation of solder resistance in the same manner as in Example 1.

The evaluated result obtained is shown in Table 1.

For the solar cell modules obtained in the above, evaluation was conducted with respect to exterior appearance, shunt resistance, initial photoelectric conversion efficiency, and photoelectric conversion efficiency after endurance in the same manner as in Example 1.

The evaluated results obtained are collectively shown in Table 1.

EXAMPLE 5

The procedures described in the steps 1 to 3 in Example 1 were repeated, except that the adhesive body used in the preparation of photovoltaic device (the step 3) was replaced by a adhesive body comprising a stacked body comprised of a 50 μm thick silicone adhesive layer/a 50 μm thick polyimide film layer/a 50 μm thick silicone adhesive layer, to thereby obtain 12 photovoltaic devices.

Of the resultant 12 photovoltaic devices, (i) ten of them were maintained in an atmosphere of 25° C./50% RH for 12 hours (these photovoltaic devices will be hereinafter referred to as photovoltaic devices maintained in the atmosphere (i)), (ii) one of the two remaining photovoltaic device was maintained in an atmosphere of 35° C./90% RH for 12 hours (this photovoltaic device will be hereinafter referred to as photovoltaic device maintained in the atmosphere (ii)), and (iii) the residual one photovoltaic device was reserved for evaluation of solder resistance.

For each of the photovoltaic devices maintained in the atmosphere (i) and the photovoltaic device maintained in the atmosphere (ii), resin sealing was conducted in the same manner described in the step 4 of Example 1, whereby eleven solar cell modules were obtained.

EVALUATION

For the photovoltaic device reserved in the above was subjected to evaluation of solder resistance in the same manner as in Example 1.

The evaluated result obtained is shown in Table 1.

For the solar cell modules obtained in the above, evaluation was conducted with respect to exterior appearance, shunt resistance, initial photoelectric conversion efficiency, and photoelectric conversion efficiency after endurance in the same manner as in Example 1.

The evaluated results obtained are collectively shown in Table 1.

COMPARATIVE EXAMPLE 1

The procedures described in the steps 1 to 3 in Example 1 were repeated, except that the adhesive body used in the preparation of photovoltaic device (the step 3) was replaced by a conventional adhesive body with no polymer film layer, to thereby obtain 12 photovoltaic devices.

Of the resultant 12 photovoltaic devices, (i) ten of them were maintained in an atmosphere of 25° C./50% RH for 12 hours (these photovoltaic devices will be hereinafter referred to as photovoltaic devices maintained in the atmosphere (i)), (ii) one of the two remaining photovoltaic device was maintained in an atmosphere of 35° C./90% RH for 12 hours (this photovoltaic device will be hereinafter referred to as photovoltaic device maintained in the atmosphere (ii)), and (iii) the residual one photovoltaic device was reserved for evaluation of solder resistance.

For each of the photovoltaic devices maintained in the atmosphere (i) and the photovoltaic device maintained in the atmosphere (ii), resin sealing was conducted in the same manner described in the step 4 of Example 1, whereby eleven solar cell modules were obtained.

EVALUATION

For the photovoltaic device reserved in the above was subjected to evaluation of solder resistance in the same manner as in Example 1.

The evaluated result obtained is shown in Table 1.

For the solar cell modules obtained in the above, evaluation was conducted with respect to exterior appearance, shunt resistance, initial photoelectric conversion efficiency, and photoelectric conversion efficiency after endurance in the same manner as in Example 1.

The evaluated results obtained are collectively shown in Table 1.

COMPARATIVE EXAMPLE 2

The procedures described in the steps 1 to 3 in Example 1 were repeated, except that the adhesive body used in the preparation of photovoltaic device (the step 3) was replaced by a adhesive body comprising a stacked body comprised of a 50 μm thick acrylic adhesive layer/a 150 μm thick nylon film layer/a 50 μm thick acrylic adhesive layer, to thereby obtain 12 photovoltaic devices.

Of the resultant 12 photovoltaic devices, (i) ten of them were maintained in an atmosphere of 25° C./50% RH for 12 hours (these photovoltaic devices will be hereinafter referred to as photovoltaic devices maintained in the atmosphere (i)), (ii) one of the two remaining photovoltaic device was maintained in an atmosphere of 35° C./90% RH for 12 hours (this photovoltaic device will be hereinafter referred to as photovoltaic device maintained in the atmosphere (ii)), and (iii) the residual one photovoltaic device was reserved for evaluation of solder resistance.

For each of the photovoltaic devices maintained in the atmosphere (i) and the photovoltaic device maintained in the atmosphere (ii), resin sealing was conducted in the same manner described in the step 4 of Example 1, whereby eleven solar cell modules were obtained.

EVALUATION

For the photovoltaic device reserved in the above was subjected to evaluation of solder resistance in the same manner as in Example 1.

The evaluated result obtained is shown in Table 1.

For the solar cell modules obtained in the above, evaluation was conducted with respect to exterior appearance, shunt resistance, initial photoelectric conversion efficiency, and photoelectric conversion efficiency after endurance in the same manner as in Example 1.

The evaluated results obtained are collectively shown in Table 1.

COMPARATIVE EXAMPLE 3

The procedures described in the steps 1 to 3 in Example 1 were repeated, except that the adhesive body used in the preparation of photovoltaic device (the step 3) was replaced by a adhesive body comprising a stacked body comprised of a 50 μm thick silicone adhesive layer/a 50 μm thick nylon film layer/a 50 μm thick silicone adhesive layer, to thereby obtain 12 photovoltaic devices.

Of the resultant 12 photovoltaic devices, (i) ten of them were maintained in an atmosphere of 25° C./50% RH for 12 hours (these photovoltaic devices will be hereinafter referred to as photovoltaic devices maintained in the atmosphere (i)), (ii) one of the two remaining photovoltaic device was maintained in an atmosphere of 35° C./90% RH for 12 hours (this photovoltaic device will be hereinafter referred to as photovoltaic device maintained in the atmosphere (ii)), and (iii) the residual one photovoltaic device was reserved for evaluation of solder resistance.

For each of the photovoltaic devices maintained in the atmosphere (i) and the photovoltaic device maintained in the atmosphere (ii), resin sealing was conducted in the same manner described in the step 4 of Example 1, whereby eleven solar cell modules were obtained.

EVALUATION

For the photovoltaic device reserved in the above was subjected to evaluation of solder resistance in the same manner as in Example 1.

The evaluated result obtained is shown in Table 1.

For the solar cell modules obtained in the above, evaluation was conducted with respect to exterior appearance, shunt resistance, initial photoelectric conversion efficiency, and photoelectric conversion efficiency after endurance in the same manner as in Example 1.

The evaluated results obtained are collectively shown in Table 1.

TABLE 1

|  |  |  | Example | | | | | Comparative Example | | |
|---|---|---|---|---|---|---|---|---|---|---|
|  |  |  | 1 | 2 | 3 | 4 | 5 | 1 | 2 | 3 |
| photo- voltaic device | solder resistance | | ○ | ○ | ○ | Δ | ○ | x | Δ | Δ |
| solar cell module | exterior appearance after the lamination | (1) | ○ | ○ | ○ | ○ | ○ | ○ | ○ | ○ |
|  |  | (2) | ○ | Δ | ○ | ○ | Δ | Δ | Δ | ○ |
|  | shunt resistance | | ○ | ○ | ○ | ○ | ○ | Δ | Δ | Δ |
|  | initial photoelectric conversion efficiency | | ○ | ○ | ○ | ○ | ○ | x | Δ | Δ |
|  | photoelectric conversion efficiency after endurance | | ○ | ○ | ○ | ○ | ○ | x | x | x |

(1): maintained in an atmosphere of 25° C./50% RH
(2): maintained in an atmosphere of 35° C./90% RH Based on the results shown in Table 1, the following facts are understood.

In Examples 1 to 5 of the present invention in which the adhesive bodies having the specific heat resistant polymer film is used, any of the resultant photovoltaic elements excels characteristics required for a photovoltaic element. Particularly, the photovoltaic element according to the present invention excels in solder resistance, namely, it is substantially free of damage due to heat of the solder. In addition, a desired interval can be maintained between the bus bar and the photovoltaic element and because of this, the photovoltaic element is desirably protected from being suffered from problems due to bur or fracture of the metal body used as the bus bar.

On the other hand, in the case of Comparative Example 1 in which no polymer film is used in the adhesive body, the photovoltaic element is inferior in solder resistance. Because of this, there is a tendency for the photovoltaic element to be readily short-circuited, whereby the photovoltaic element is inferior not only in initial photoelectric conversion efficiency but also in photoelectric conversion efficiency after the endurance.

In the case of Comparative Examples 2 and 3 in which the adhesive body having the nylon film having inferior heat resistance as the polymer film is used, any of the photovoltaic elements obtained in these comparative examples is inferior in solder resistance. Because of this, there is a tendency for any of the photovoltaic elements to be readily short-circuited, whereby the photovoltaic element is inferior not only in initial photoelectric conversion efficiency but also in photoelectric conversion efficiency after the endurance.

Now, the present invention provides various advantages as will be described below.

(1) As the specific adhesive body comprising at least one or more kinds of adhesive material and one or more kinds of heat resistant polymer film layer is used, if heat of 300° C. to 400° C. should be locally applied upon connecting the metallic wire onto the bus bar by means of the solder, the photovoltaic element can be desirably protected from being damaged due to the heat applied and because of this, the yield of the photovoltaic element produced is desirably improved. In addition, the heat resistant polymer film layer of the adhesive body enables to maintain a desired interval between the bus bar and the photovoltaic element and because of this, the photovoltaic element is desirably protected from being suffered from problems due to bur or fracture of the metal body used as the bus bar.

(2) By contacting at least a part of the metallic wire to the surface of the photovoltaic element through the electrically conductive adhesive, the current collecting property of the metallic wire is markedly improved. In addition, to use the metallic wire enables to establish a highly reliable electrode structure with a markedly diminished shadow loss for the photovoltaic element.

(3) By making the bus bar have such a structure that at least a part thereof is covered by an electrically conductive paste, the connection of the bus bar with the metallic wire can be more ensured and in addition to this, the contact resistance of the connection face between them can be desirably diminished.

(4) By coating the metallic wire by an electrically conductive paste, metal ions from the metallic wire can be desirably prevented from being migrated into the power generation active area of the photovoltaic element, whereby the occurrence of shunt due to the metal migration can be effectively prevented, resulting in a marked improvement in the reliability of the photovoltaic element.

(5) By using an adhesive material exhibiting a hygroscopicity of 1.5 or less when maintained in an atmosphere of 40° C./80% RH for 12 hours as the constituent of the adhesive body, resin sealing for the photovoltaic element can be effectively conducted such that it has a resin seal having a desirable external appearance with no defect such as pore or air bubble.

(6) By using an adhesive material having an excellent electrically insulating property as the constituent of the adhesive body, there can be attained the production of a reliable photovoltaic device excelling in electrical characteristics such that power generation is efficiently conducted and the electricity generated is efficiently collected by the bus bar.

(7) The present invention includes a process for the production of a photovoltaic device, characterized by comprising the steps of providing a photovoltaic element, arranging an adhesive body comprising an adhesive material and a heat resistant polymer film layer on the photovoltaic element, arranging a metallic wire as a collecting electrode on the adhesive body and the photovoltaic element, arranging a bus bar on the adhesive body and the collecting electrode, and bonding the collecting electrode and the bus bar using an electrically conductive adhesive and by way of heat or/and pressure. This process provides significant advantages in that the formation of the collecting electrode and the connection of the bus bar are concurrently conducted while conducting the fixing of the collecting electrode and the fixing of the bus bar by means of the adhesive body, and hence, a highly reliable photovoltaic device can be efficiently produced at an improved yield by a simplified production process with a diminished number of steps.

What is claimed is:

1. A photovoltaic device comprising: a photovoltaic element having a metallic wire and a bus bar, said photovoltaic element comprising a substrate having an electrically conductive surface, a semiconductor layer formed on said electrically conductive surface of said substrate, and a transparent and electrically conductive electrode layer formed on said semiconductor layer, said photovoltaic element having a power generation region having said metallic wire arranged over said transparent and electrically conductive electrode layer, said photovoltaic element having a fixing region for fixing an end portion of said metallic wire, wherein said metallic wire is fixed to a polymer film through an adhesive material while being electrically connected with said bus bar.

2. A photovoltaic device according to claim 1, wherein the fixing region comprises a part of an exposed portion of the substrate.

3. A photovoltaic device according to claim 1, wherein the fixing region comprises a part of an exposed portion of the semiconductor layer.

4. A photovoltaic device according to claim 1, wherein the fixing region is situated on a part of the transparent and electrically conductive electrode layer and said part of the transparent and electrically conductive electrode layer comprises a non-connection part of the transparent and electrically conductive electrode layer with the semiconductor layer.

5. A photovoltaic device according to claim 1, wherein the fixing region is formed by removing at least a part of the transparent and electrically conductive electrode layer.

6. A photovoltaic device according to claim 1, wherein at least a part of the metallic wire is fixed to the surface of the transparent and electrically conductive electrode layer on the semiconductor layer by means of an electrically conductive adhesive.

7. A photovoltaic device according to claim 1, wherein the adhesive material has a hygroscopicity of 0.0% to 1.5% when maintained in an atmosphere of 40° C./80% RH for 12 hours.

8. A photovoltaic device according to claim 1, wherein the adhesive material comprises one or more adhesive materials selected from the group consisting of acrylic adhesive materials, rubber series adhesive materials, silicone series adhesive materials, polvinyl ether series adhesive materials, epoxy series adhesive materials, polyurethane series adhesive materials, nylon series adhesive materials, polyamide series adhesive materials, inorganic adhesive materials, and composite type adhesive materials.

9. A photovoltaic device according to claim 1, wherein the polymer film comprises a polymer resin film at least having a melting point of more than 250° C.

10. A photovoltaic device according to claim 1, wherein the polymer film is constituted by one or more materials selected from the group consisting of cellophane, rayon, acetate, polyethylene, polyethylene terephthalate, polyether ketone, fluororesin, polysulfone, unsaturated polyester, epoxy resin, polyamide resin, polyamide-imide resin, and polyimide-silicone resin.

11. A photovoltaic device according to claim 1, wherein the semiconductor layer comprises a non-single crystal semiconductor material.

12. A photovoltaic device comprising: a photovoltaic element having a metallic wire and a bus bar, said photovoltaic element comprising a substrate having an electrically conductive surface, a semiconductor layer formed on said electrically conductive surface of said substrate, and a transparent and electrically conductive electrode layer formed on said semiconductor layer, said photovoltaic element having a power generation region having said metallic wire arranged over said transparent and electrically conductive electrode layer, said photovoltaic element having a fixing region for fixing an end portion of said metallic wire, wherein said metallic wire is fixed to a polymer film through an adhesive material and said metallic wire is positioned between said bus bar and said adhesive material while electrically connecting with said bus bar.

13. A photovoltaic device according to claim 12, wherein the metallic wire is electrically connected with the bus bar by means of an electrically conductive adhesive.

14. A photovoltaic device according to claim 12, wherein at least a part of the bus bar has an electrically conductive adhesive applied thereon.

15. A photovoltaic device according to claim 12, wherein at least a part of the metallic wire is fixed to the surface of the transparent and electrically conductive electrode layer on the semiconductor layer by means of an electrically conductive adhesive.

16. A photovoltaic device according to claim 12, wherein the fixing region comprises a part of an exposed portion of the substrate.

17. A photovoltaic device according to claim 12, wherein the fixing region comprises a part of an exposed portion of the semiconductor layer.

18. A photovoltaic device according to claim 12, wherein the fixing region is situated on a part of the transparent and electrically conductive electrode layer and said part of the transparent and electrically conductive electrode layer comprises a non-connection part of the transparent and electrically conductive electrode layer with the semiconductor layer.

19. A photovoltaic device according to claim 12, wherein the fixing region is formed by removing at least a part of the transparent and electrically conductive electrode layer.

20. A photovoltaic device according to claim 12, wherein the adhesive material has a hygroscopicity of 0.0% to 1.5% when maintained in an atmosphere of 40° C./80% RH for 12 hours.

21. A photovoltaic device according to claim 12, wherein the adhesive material comprises one or more adhesive materials selected from the group consisting of acrylic adhesive materials, rubber series adhesive materials, silicone series adhesive materials, polvinyl ether series adhesive materials, epoxy series adhesive materials, polyurethane series adhesive materials, nylon series adhesive materials, polyamide series adhesive materials, inorganic adhesive materials, and composite type adhesive materials.

22. A photovoltaic device according to claim 12, wherein the polymer film comprises a polymer resin film at least having a melting point of more than 250° C.

23. A photovoltaic device according to claim 12, wherein the polymer film is constituted by one or more materials selected from the group consisting of cellophane, rayon, acetate, polyethylene, polyethylene terephthalate, polyether ketone, fluororesin, polysulfone, unsaturated polyester, epoxy resin, polyamide resin, polyamide-imide resin, and polyimide-silicone resin.

24. A photovoltaic device according to claim 12, wherein the semiconductor layer comprises a non-single crystal semiconductor material.

25. A solar cell module comprising: a photovoltaic device resin-sealed on a reinforcing material and a protective film by which said photovoltaic device is covered, said photovoltaic device comprising a photovoltaic element having a metallic wire and a bus bar, said photovoltaic element comprising a substrate having an electrically conductive surface, a semiconductor layer formed on said electrically conductive surface of said substrate, and a transparent and electrically conductive electrode layer formed on said semiconductor layer, said photovoltaic element having a power generation region having said metallic wire arranged over said transparent and electrically conductive electrode layer, said photovoltaic element having a fixing region for fixing an end portion of said metallic wire, wherein said metallic wire is fixed to a polymer film through an adhesive material while being electrically connected with said bus bar.

26. A construction member comprising a photovoltaic device resin sealed on a reinforcing material and a protective film by which said photovoltaic device is covered, a part of said reinforcing material being bent, said photovoltaic device comprising a photovoltaic element having a metallic wire and a bus bar, said photovoltaic element comprising a substrate having an electrically conductive surface, a semiconductor layer formed on said electrically conductive surface of said substrate, and a transparent and electrically conductive electrode layer formed on said semiconductor layer, said photovoltaic element having a power generation region having said metallic wire arranged over said transparent and electrically conductive electrode layer of said photovoltaic element, said photovoltaic element having a fixing region for fixing an end portion of said metallic wire, wherein said metallic wire is fixed to a polymer film through an adhesive material while being electrically connected with said bus bar.

27. A power conversion apparatus comprising a solar cell module and a controller for controlling a power outputted from said solar cell module, said solar cell module comprising a photovoltaic device resin-sealed on a reinforcing material and a protective film by which said photovoltaic device is covered, said photovoltaic device comprising a photovoltaic element having a metallic wire and a bus bar, said photovoltaic element comprising a substrate having an electrically conductive surface, a semiconductor layer formed on said electrically conductive surface of said substrate, and a transparent and electrically conductive electrode layer formed on said semiconductor layer, said photovoltaic element having a power generation region having said metallic wire arranged over said transparent and electrically conductive electrode layer of said photovoltaic element, said photovoltaic element having a fixing region for fixing an end portion of said metallic wire, wherein said metallic wire is fixed to a polymer film through an adhesive material while being electrically connected with said bus bar.

* * * * *

UNITED STATES PATENT AND TRADEMARK OFFICE
CERTIFICATE OF CORRECTION

PATENT NO. : 6,121,542
DATED : September 19, 2000
INVENTOR(S) : Shiotsuka et al.

It is certified that error appears in the above-identified patent and that said Letters Patent is hereby corrected as shown below:

Columns 27-28,
Delete claims 1, 14, 15 and 16 and substitute therefore the attached claims 1, 14, 15 and 16 as follows:

1. (Twice Amended) A photovoltaic device comprising: a photovoltaic element having a metallic wire and a bus bar, said photovoltaic element comprising a substrate having an electrically conductive surface, a semiconductor layer formed on said electrically conductive surface of said substrate, and a transparent and electrically conductive electrode layer formed on said semiconductor layer, said photovoltaic element having a power generation region having said metallic wire arranged over said transparent and electrically conductive electrode layer, said photovoltaic element having a fixing region for fixing an end portion of said metallic wire, wherein said metallic wire is fixed to a stacked body comprising a polymer film [through an adhesive material] interposed between a pair of adhesive materials and said metallic wire is positioned between said bus bar and said [adhesive material] stacked body while being electrically [connecting] connected with said bus bar, said polymer film comprising a polymer material having a melting point of more than 250° C.

14. (Twice Amended) A solar cell module comprising: a photovoltaic device resin-sealed on a reinforcing material and a protective film by which said photovoltaic device is covered, said photovoltaic device comprising a photovoltaic element having a metallic wire and a bus bar, said photovoltaic element comprising a substrate having an electrically conductive surface, a semiconductor layer formed on said electrically conductive surface of said substrate, and a transparent and electrically conductive electrode layer formed on said semiconductor layer, said photovoltaic element having a power generation region having said metallic wire arranged over said transparent and electrically conductive electrode layer, said photovoltaic element having a fixing region for fixing an end portion of said metallic wire, wherein said metallic wire is fixed to a stacked body comprising a polymer film [through an adhesive material] interposed between a pair of adhesive materials and said metallic wire is positioned between said bus bar and said stacked body while being electrically connected with said bus bar, said polymer film comprising a polymer material having a melting point of more than 250° C.

UNITED STATES PATENT AND TRADEMARK OFFICE
CERTIFICATE OF CORRECTION

PATENT NO. : 6,121,542
DATED : September 19, 2000
INVENTOR(S) : Shiotsuka et al.

It is certified that error appears in the above-identified patent and that said Letters Patent is hereby corrected as shown below:

15. (Twice Amended) A construction member comprising a photovoltaic device resin sealed on a reinforcing material and a protective film by which said photovoltaic device is covered, a part of said reinforcing material being bent, said photovoltaic device comprising a photovoltaic element having a metallic wire and a bus bar, said photovoltaic element comprising a substrate having an electrically conductive surface, a semiconductor layer formed on said electrically conductive surface of said substrate, and a transparent and electrically conductive electrode layer formed on said semiconductor layer, said photovoltaic element having a power generation region having said metallic wire arranged over said transparent and electrically conductive, electrode layer of said photovoltaic element, said photovoltaic element having a fixing region for fixing an end portion of said metallic wire, wherein said metallic wire is fixed to a stacked body comprising a polymer film [through an adhesive material] interposed between a pair of adhesive materials and said metallic wire is positioned between said bus bar and said stacked body while being electrically connected with said bus bar, said polymer film comprising a polymer material having a melting point of more than 250° C.

16. (Twice Amended) A power conversion apparatus comprising a solar cell module and a controller for controlling a power outputted from said solar cell module, said solar cell module comprising a photovoltaic device resin-sealed on a reinforcing material and a protectivefilm by which said photovoltaic device is covered, said photovoltaic device comprising a photovoltaic element having a metallic wire and a bus bar, said photovoltaic element comprising a substrate having an electrically conductive surface, a semiconductor layer formed on said electrically conductive surface of said substrate, and a transparent and electrically conductive electrode layer formed on said semiconductor layer, said photovoltaic element having a power generation region having said metallic wire arranged over said transparent and electrically conductive electrode layer of said photovoltaic element, said photovoltaic element having a fixing region for fixing an end portion of said metallic wire, wherein said metallic wire is fixed to a stacked body comprising a polymer film [through an adhesive material] interposed between a pair of adhesive materials and said metallic wire is positioned between said bus bar and said stacked body while being electrically connected with said bus bar, said polymer film comprising a polymer material having a melting point of more 004 than 2500 C.

UNITED STATES PATENT AND TRADEMARK OFFICE
CERTIFICATE OF CORRECTION

PATENT NO. : 6,121,542
DATED : September 19, 2000
INVENTOR(S) : Shiotsuka et al.

It is certified that error appears in the above-identified patent and that said Letters Patent is hereby corrected as shown below:

REMARKS
The claims now in issue are 12-24 and 29-31. Claims 1-11 have been canceled without prejudice or disclaimer. All the independent claims, 12, 29, 30 and 31 have been amended to more clearly recite the invention and to more clearly distinguish the references which are cited in the accompanying Information Disclosure Statement. No new matter has been added as the limitations added to the claims may be found in the specification at page 27, lines 6-7 and page 51, lines 16-22, for example.
     Applicants respectfully request consideration of the claims as amended and in view of the Applicants comments, found below, on the references newly cited.

INFORMATION DISCLOSURE STATEMENT
     In compliance with the duty of disclosure under 37 C.F.R. § 1.56 and in accordance with the practice under 37 C.F.R. §§ 1.97 and 1.98, the Examiner's attention is directed to the documents listed on the enclosed Form PTO-1449. Copies of the listed documents are also enclosed.

Signed and Sealed this

Twentieth Day of July, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,121,542
DATED : September 19, 2000
INVENTOR(S) : Hidenori Shiotsuka et al.

It is certified that error appears in the above-identified patent and that said Letters Patent is hereby corrected as shown below:

Column 3,
Line 5, "A–A'" should read -- 1(b) --;
Line 7, "B–B'" should read -- 1(c) --;
Line 26, "A–A'" should read -- 4(b) --;
Line 28, "B–B'" should read -- 4(c) --; and
Line 29, "illustration" should read -- illustrating --.

Column 5,
Line 21, "A–A'" should read -- 1(b) --; and
Line 22, "B–B'" should read -- 1(c) --.

Column 6,
Line 24, "trough" should read -- through --; and
Line 46, "202 a" should read -- 202 an --.

Column 7,
Line 1, "be also" should read -- also be --;
Line 42, "A–A'" should read -- 4(b) --; and
Line 43, "B–B'" should read -- 4(c) --.

Column 9,
Line 67, "kind" should read -- kinds of --.

Column 10,
Line 1, "kind" should read -- kinds of --.

Column 12,
Line 21, "superpose" should read -- superposed --;
Line 37, "being" should read -- been --;
Line 46, "electrically" should read -- electrical --;
Line 47, "example" should read -- examples --; and
Line 47, "pigment" should read -- pigments --.

Column 13,
Line 27, "100 .cm," should read -- 100 Ω.cm --.

Column 14,
Line 59, "fist" should read -- first --.

UNITED STATES PATENT AND TRADEMARK OFFICE
CERTIFICATE OF CORRECTION

PATENT NO.     : 6,121,542
DATED          : September 19, 2000
INVENTOR(S)    : Hidenori Shiotsuka et al.

It is certified that error appears in the above-identified patent and that said Letters Patent is hereby corrected as shown below:

Column 15,
Lines 41 and 63, "structure," should read -- structures, --.

Column 16,
Line 64, "second" should read -- seconds --.

Column 17,
Line 44, "1 um." should read -- 1 $\mu$m. --; and
Line 62, "40 m/min.," should read -- 4 mm/min., --.

Column 18,
Line 11, "125 um" should read -- 125 $\mu$m --.

Column 19,
Line 9, "preesion" should read -- pression --.

Column 20,
Line 4, "module" should read -- modules --; and
Line 49, "vale" should read -- value --.

Column 27, line 2 through Column 30, line 24,
Claims 1-27 should be deleted and substituted with the following claims 1-16:

--1.     A photovoltaic device comprising: a photovoltaic element having a metallic wire and a bus bar, said photovoltaic element comprising a substrate having an electrically conductive surface, a semiconductor layer formed on said electrically conductive surface of said substrate, and a transparent and electrically conductive electrode layer formed on said semiconductor layer, said photovoltaic element having a power generation region having said metallic wire arranged over said transparent and electrically conductive electrode layer, said photovoltaic element having a fixing region for fixing an end portion of said metallic wire, wherein said metallic wire is fixed to a stacked body comprising a polymer film interposed between a pair of adhesive materials and said metallic wire is positioned between said bus bar and said stacked body while being electrically connected with said bus bar, said polymer film comprising a polymer material having a melting point of more than 250° C.

2.     A photovoltaic device according to claim 1, wherein the metallic wire is electrically connected with the bus bar by means of an electrically conductive adhesive.

3.     A photovoltaic device according to claim 1, wherein at least a part of the bus bar has an electrically conductive adhesive applied thereon.

4.     A photovoltaic device according to claim 1, wherein at least a part of the metallic wire is fixed to the surface of the transparent and electrically conductive electrode layer on the semiconductor layer by means of an electrically conductive adhesive.

5.     A photovoltaic device according to claim 1, wherein the fixing region comprises a part of an exposed portion of the substrate.

UNITED STATES PATENT AND TRADEMARK OFFICE
CERTIFICATE OF CORRECTION

PATENT NO. : 6,121,542  
DATED : September 19, 2000  
INVENTOR(S) : Hidenori Shiotsuka et al.

Page 3 of 4

It is certified that error appears in the above-identified patent and that said Letters Patent is hereby corrected as shown below:

Column 27, line 2 through Column 30, line 24 (cont'd),

6. A photovoltaic device according to claim 1, wherein the fixing region comprises a part of an exposed portion of the semiconductor layer.

7. A photovoltaic device according to claim 1, wherein the fixing region is situated on a part of the transparent and electrically conductive electrode layer and said part of the transparent and electrically conductive electrode layer comprises a non-connection part of the transparent and electrically conductive electrode layer with the semiconductor layer.

8. A photovoltaic device according to claim 1, wherein the fixing region is formed by removing at least a part of the transparent and electrically conductive electrode layer.

9. A photovoltaic device according to claim 1, wherein the adhesive material has a hygroscopicity of 0.0% to 1.5% when maintained in an atmosphere of 40° C/80% RH for 12 hours.

10. A photovoltaic device according to claim 1, wherein the adhesive material comprises one or more adhesive materials selected from the group consisting of acrylic adhesive materials, rubber series adhesive materials, silicone series adhesive materials, polvinyl ether series adhesive materials, epoxy series adhesive materials, polyurethane series adhesive materials, nylon series adhesive materials, polyamide series adhesive materials, inorganic adhesive materials, and composite type adhesive materials.

11. A photovoltaic device according to claim 1, wherein the polymer film comprises a polymer resin film at least having a melting point of more than 250° C.

12. A photovoltaic device according to claim 1, wherein the polymer film is constituted by one or more materials selected from the group consisting of cellophane, rayon, acetate, polyethylene, polyethylene terephthalate, polyether ketone, fluororesin, polysulfone, unsaturated polyester, epoxy resin, polyamide resin, polyamide-imide resin, and polyimide-silicone resin.

13. A photovoltaic device according to claim 1, wherein the semiconductor layer comprises a non-single crystal semiconductor material.

14. A solar cell module comprising: a photovoltaic device resin-sealed on a reinforcing material and a protective film by which said photovoltaic device is covered, said photovoltaic device comprising a photovoltaic element having a metallic wire and a bus bar, said photovoltaic element comprising a substrate having an electrically conductive surface, a semiconductor layer formed on said electrically conductive surface of said substrate, and a transparent and electrically conductive electrode layer formed on said semiconductor layer, said photovoltaic element having a power generation region having said metallic wire arranged over said transparent and electrically conductive electrode layer, said photovoltaic element having a fixing region for fixing an end portion of said metallic wire, wherein said metallic wire is fixed to a stacked body comprising a polymer film interposed between a pair of adhesive materials and said metallic wire is positioned between said bus bar and said stacked body while being electrically connected with said bus bar, said polymer film comprising a polymer material having a melting point of more than 250° C.

UNITED STATES PATENT AND TRADEMARK OFFICE
CERTIFICATE OF CORRECTION

PATENT NO. : 6,121,542
DATED : September 19, 2000
INVENTOR(S) : Hidenori Shiotsuka et al.

It is certified that error appears in the above-identified patent and that said Letters Patent is hereby corrected as shown below:

Column 27, line 2 through Column 30, line 24 (cont'd),

15. A construction member comprising a photovoltaic device resin sealed on a reinforcing material and a protective film by which said photovoltaic device is covered, a part of said reinforcing material being bent, said photovoltaic device comprising a photovoltaic element having a metallic wire and a bus bar, said photovoltaic element comprising a substrate having an electrically conductive surface, a semiconductor layer formed on said electrically conductive surface of said substrate, and a transparent and electrically conductive electrode layer formed on said semiconductor layer, said photovoltaic element having a power generation region having said metallic wire arranged over said transparent and electrically conductive electrode layer of said photovoltaic element, said photovoltaic element having a fixing region for fixing an end portion of said metallic wire, wherein said metallic wire is fixed to a stacked body comprising a polymer film interposed between a pair of adhesive materials and said metallic wire is positioned between said bus bar and said stacked body while being electrically connected with said bus bar, said polymer film comprising a polymer material having a melting point of more than 250° C.

16. A power conversion apparatus comprising a solar cell module and a controller for controlling a power outputted from said solar cell module, said solar cell module comprising a photovoltaic device resin-sealed on a reinforcing material and a protective film by which said photovoltaic device is covered, said photovoltaic device comprising a photovoltaic element having a metallic wire and a bus bar, said photovoltaic element comprising a substrate having an electrically conductive surface, a semiconductor layer formed on said electrically conductive surface of said substrate, and a transparent and electrically conductive electrode layer formed on said semiconductor layer, said photovoltaic element having a power generation region having said metallic wire arranged over said transparent and electrically conductive electrode layer of said photovoltaic element, said photovoltaic element having a fixing region for fixing an end portion of said metallic wire, wherein said metallic wire is fixed to a stacked body comprising a polymer film interposed between a pair of adhesive materials and said metallic wire is positioned between said bus bar and said stacked body while being electrically connected with said bus bar, said polymer film comprising a polymer material having a melting point of more than 250° C.--

Signed and Sealed this

Twenty-third Day of August, 2005

JON W. DUDAS
*Director of the United States Patent and Trademark Office*